United States Patent
Do et al.

(10) Patent No.: US 8,478,805 B1
(45) Date of Patent: Jul. 2, 2013

(54) FREQUENCY SYNTHESIS WITH LOW RESOLUTION RATIONAL DIVISION DECOMPOSITION

(75) Inventors: Viet Do, Carlsbad, CA (US); Simon Pang, San Diego, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 154 days.

(21) Appl. No.: 12/985,293

(22) Filed: Jan. 5, 2011

Related U.S. Application Data

(63) Continuation-in-part of application No. 12/972,255, filed on Dec. 17, 2010, which is a continuation-in-part of application No. 12/120,027, filed on May 13, 2008, which is a continuation-in-part of application No. 11/717,261, filed on Mar. 12, 2007, now Pat. No. 7,560,426, and a continuation-in-part of application No. 11/954,325, filed on Dec. 12, 2007.

(51) Int. Cl.
*G06F 1/02* (2006.01)

(52) U.S. Cl.
USPC .......................... 708/271; 708/200; 708/270

(58) Field of Classification Search
None
See application file for complete search history.

(56) References Cited

U.S. PATENT DOCUMENTS

| | | | | |
|---|---|---|---|---|
| 4,078,203 A | * | 3/1978 | Borst | 377/47 |
| 4,991,188 A | * | 2/1991 | Perkins | 377/49 |
| 5,255,213 A | * | 10/1993 | Wasserman | 708/103 |
| 5,781,459 A | * | 7/1998 | Bienz | 708/271 |
| 6,060,936 A | * | 5/2000 | Raghunath | 327/360 |
| 2005/0156772 A1 | | 7/2005 | Melanson | |
| 2005/0270201 A1 | | 12/2005 | Maloberti et al. | |
| 2007/0241950 A1 | | 10/2007 | Petilli et al. | |
| 2008/0297386 A1 | | 12/2008 | Maloberti et al. | |
| 2009/0066549 A1 | | 3/2009 | Thomsen et al. | |
| 2009/0237284 A1 | | 9/2009 | Rheinfelder et al. | |
| 2009/0289823 A1 | | 11/2009 | Chae et al. | |
| 2009/0325632 A1 | | 12/2009 | Gambini et al. | |
| 2010/0079323 A1 | | 4/2010 | Miao | |
| 2010/0103003 A1 | | 4/2010 | Philippe et al. | |
| 2010/0103013 A1 | | 4/2010 | Philippe et al. | |
| 2010/0245144 A1 | | 9/2010 | Robbe et al. | |
| 2010/0277355 A1 | | 11/2010 | Chen | |

OTHER PUBLICATIONS

Kozak et al., "A Pipelined Noise Shaping Coder for Fractional-N Frequency Synthesis", IEEE Transactions on Instrumentation and Measurement, vol. 50, No. 5, Oct. 2001, 1154-116.

\* cited by examiner

*Primary Examiner* — Michael D Yaary
(74) *Attorney, Agent, or Firm* — Turocy & Watson, LLP

(57) ABSTRACT

A method is provided for synthesizing signal frequencies using low resolution rational division decomposition in a frequency synthesis device. An integer numerator (n) and an integer denominator (d) ratio is reduced; $n/d = I_O(N_O/D_O) = I_O + N_O/D_O = (I_O+1) - (D_O-N_O)/D_O$, and where $N_O/D_O < 1$ and $N_O$ and $D_O$ are integers. $N_O$ is reduced; $N_O = I_n(N_n/D_n) = I_n + N_n/D_n = (I_n+1) - (D_n-N_n)/D_n$, where $I_n$, $N_n$, and $D_n$ are integers, and $N_n/D_n < 1$. $I_n$, $N_n$, and $D_n$ are used to create a final numerator divisor. $D_O$ is reduced; $D_O = I_d(N_d/D_d) = I_d + N_d/D_d = (I_d+1) - (D_d-N_d)/D_d$, where $I_d$, $N_d$, and $D_d$ are integers, and $N_d/D_d < 1$. $I_d$, $N_d$, and $D_d$ are used to create a final denominator divisor. Finally, $I_O$, the final numerator divisor, and the final denominator divisor are used to create a final divisor.

27 Claims, 21 Drawing Sheets

| Mode | total_contribution[4:0] | total_contribution values |
|---|---|---|
| First Order | contribution1 = $c_1[n]$ | 0,1 |
| Second Order | contribution1 + contribution2 = $c_1[n] + c_2[n] - c_2[n-1]$ | -1,0,1,2 |
| Third Order | contribution1 + contribution2 + contribution3 = $c_1[n] + c_2[n] - c_2[n-1] + c_3[n] - 2c_3[n-1] + c_3[n-2]$ | -3,-2,-1,0,1,2,3,4 |
| Fourth Order | contribution1 + contribution2 + contribution3 + contribution4 = $c_1[n] + c_2[n] - c_2[n-1] + c_3[n] - 2c_3[n-1] + c_3[n-2] + c_4[n] - 3c_4[n-1] + 3c_4[n-2] - c_4[n-3]$ | -7,-6,-5,-4,-3,-2, -1,0,1,2,3,4,5,6,7,8 |

FIG. 2
(Prior Art)

FREQUENCY SYNTHESIS WITH LOW RESOLUTION RATIONAL DIVISION DECOMPOSITION

RELATED APPLICATIONS

This application is a continuation-in-part of a pending application entitled, FREQUENCY SYNTHESIS WITH LOW RESOLUTION RATIONAL DIVISION, invented by Viet Do et al., Ser. No. 12/972,255, filed Dec. 17, 2010, which is a Continuation-in-Part of a pending application entitled, FREQUENCY SYNTHESIS RATIONAL DIVISION, invented by Viet Do et al., Ser. No. 12/120,027, filed May 13, 2008, which is a Continuation-in-Part of the following applications:

application entitled, HIGH SPEED MULTI-MODULUS PRESCALAR DIVIDER, invented by An et al., Ser. No. 11/717,261, filed Mar. 12, 2007, now U.S. Pat. No. 7,560,426; and pending application entitled, FLEXIBLE ACCUMULATOR FOR RATIONAL DIVISION, invented by Do et al., Ser. No. 11/954,325, filed Dec. 12, 2007. All the above-referenced applications are incorporated herein by reference.

BACKGROUND OF THE INVENTION

1. Field of the Invention

This invention generally relates to a phase-locked loop (PLL) frequency synthesis system and, more particularly, to a frequency synthesis, low resolution, rational number frequency division system, such as might be used in a PLL.

2. Description of the Related Art

Conventional fractional-N frequency synthesizers use fractional number decimal values in their PLL architectures. Even synthesizers that are conventionally referred to as "rational" frequency synthesizers operate by converting a rational number, with an integer numerator and integer denominator, into resolvable or approximated fractional numbers. These frequency synthesizers do not perform well because of the inherent fractional spurs that are generated in response to the lack of resolution of the number of bits representing the divisor in the feedback path of the frequency synthesizer.

FIG. 1 is a schematic block diagram depicting an accumulator circuit capable of performing a division operation (prior art). As noted in "A Pipelined Noise Shaping Coder for Fractional-N Frequency Synthesis", by Kozak et al., IEEE Trans. on Instrumentation and Measurement, Vol. 50, No. 5, October 2001, the depicted $4^{th}$ order device can be used to determine a division ratio using an integer sequence.

The carry outs from the 4 accumulators are cascaded to accumulate the fractional number. The carry outs are combined to reduce quantization noise by adding their contributions are follows:

contribution $1=c1[n]$;
contribution $2=c2[n]-c2[n-1]$;
contribution $3=c3[n]-2c3[n-1]+c3[n-2]$;
contribution $4=c4[n]-3c4[n-1]+3c4[n-2]-c4[n-3]$;

where n is equal to a current time, and (n−1) is the previous time. Cx[n] is equal to a current value, and Cx[n−1] is equal to a previous value.

FIG. 2 shows the contributions made by the accumulator depicted in FIG. 1 with respect to order (prior art). A fractional number or fraction is a number that expresses a ratio of a numerator divided by a denominator. Some fractional numbers are rational—meaning that the numerator and denominator are both integers. With an irrational number, either the numerator or denominator is not an integer (e.g., $\pi$). Some rational numbers cannot be resolved (e.g., 10/3), while other rational numbers may only be resolved using a large number of decimal (or bit) places. In these cases, or if the fractional number is irrational, a long-term mean of the integer sequence must be used as an approximation.

The above-mentioned resolution problems are addressed with the use of a flexible accumulator, as described in parent application Ser. No. 11/954,325. The flexible accumulator is capable of performing rational division, or fractional division if the fraction cannot be sufficiently resolved, or if the fraction is irrational. The determination of whether a fraction is a rational number may be trivial in a system that transmits at a single frequency, especially if the user is permitted to select a convenient reference clock frequency. However, modern communication systems are expected to work at a number of different synthesized frequencies using a single reference clock. Further, the systems must be easily reprogrammable for different synthesized frequencies, without changing the single reference clock frequency.

While it may be possible to resolve almost any fraction using rational division, practically, there are limits to the size of registers. That is, given the number of bit positions carried in a register, or series or registers, the numerator of some fractions may be resolved with more bits than there are bit positions. In that case, even a rational division system must truncate bits or make approximations, which result in PLL frequency jitter.

It would be advantageous if a means existed for determining a divisor in response to knowing the reference clock frequency and the desired synthesized frequency value. It would be advantageous if this means could determine if the divisor is a rational number. Further, it would be advantageous if a means existing for resolving rational division numerators with a minimum number of bits. Finally, it would be advantageous if large numerator and denominators values could be resolved with a smaller bit resolution.

SUMMARY OF THE INVENTION

In frequency synthesis applications, there is often a need to use a single reference clock frequency to create multiple output frequencies, where the ratio between output frequency and reference frequency includes a fractional number. The present invention accumulator permits the use of a true rational number as the dividend and divisor, to avoid the use of approximations when the rational number can only be resolved (forming a repeating sequence) using a large number of bit places. The system provides a solution to PLL frequency synthesis by calculating the divisor needed for utilizing these flexible accumulators to perform either rational or fractional division in the feedback path of the PLL. The system disclosed herein also compares the number of bits in the numerator calculated for rational division to a threshold. If the threshold is exceeded, the system uses complementing functions to reduce the bit resolution needed to achieve the identical result. If the threshold of the numerator, or the denominator, is still exceeded, the numerator and denominator are decomposed into sub-divisors.

Accordingly, a method is provided for synthesizing signal frequencies using low resolution rational division decomposition in a frequency synthesis device. In response to dividing a synthesized frequency value by a reference frequency value, an integer value numerator (n) and an integer value denominator (d) are determined. The ratio is then reduced; $n/d=I_O(N_O/D_O)=I_O+N_O/D_O=(I_O+1)-(D_O-N_O)/D_O$, and where $N_O/D_O<1$ and $N_O$ and $D_O$ are integers. $N_O$ is reduced; $N_O=I_n$ $(N_n/D_n) = I_n + N_n/D_n = (I_n+1) - (D_n-N_n)/D_n$, where $I_n$, $N_n$, and $D_n$ are integers, and $N_n/D_n < 1$. $I_n$, $N_n$, and $D_n$ are used to create a final numerator divisor. $D_O$ is reduced; $D_O = I_d(N_d/D_d) = I_d + N_d/D_d = (I_d+1) - (D_d-N_d)/D_d$, where $I_d$, $N_d$, and $D_d$ are integers, and $N_d/D_d < 1$. $I_d$, $N_d$, and $D_d$ are used to create a final denominator divisor. Finally, $I_O$, the final numerator divisor, and the final denominator divisor are used to create a final divisor.

Additional details of the above-described method and frequency synthesis system for low resolution rational division decomposition are presented below.

BRIEF DESCRIPTION OF THE DRAWINGS

FIG. 2 shows the contributions made by the accumulator depicted in FIG. 1 with respect to order (prior art).

DETAILED DESCRIPTION

Figure 1:
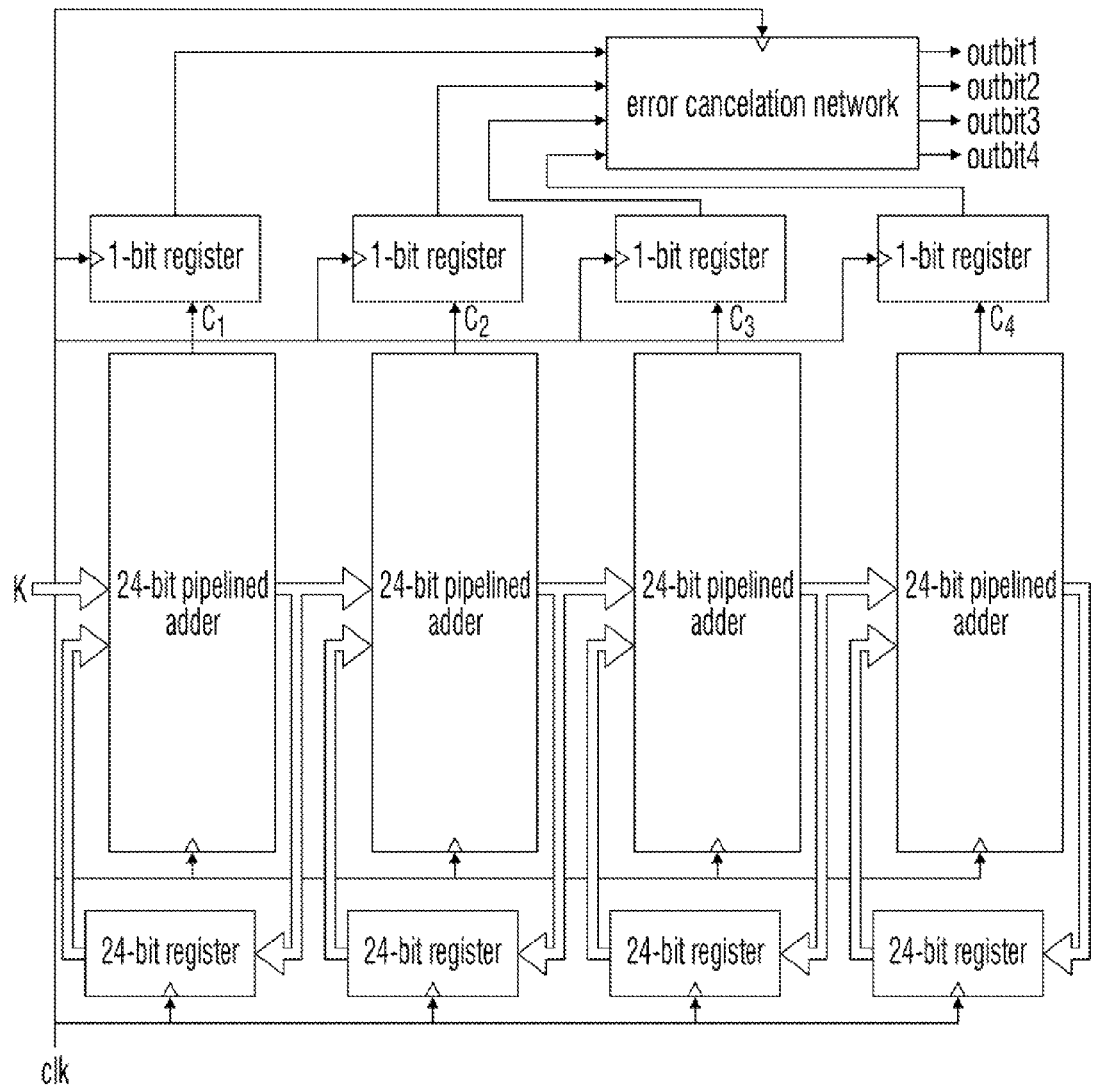
FIG. 1 is a schematic block diagram depicting an accumulator circuit capable of performing a division operation (prior art).

Various embodiments are now described with reference to the drawings. In the following description, for purposes of explanation, numerous specific details are set forth in order to provide a thorough understanding of one or more aspects. It may be evident, however, that such embodiment(s) may be practiced without these specific details. In other instances, well-known structures and devices are shown in block diagram form in order to facilitate describing these embodiments.

As used in this application, the terms "processor", "processing device", "component," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device can be a component. One or more components can reside within a process and/or thread of execution and a component may be localized on one computer and/or distributed between two or more computers. In addition, these components can execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Various embodiments will be presented in terms of systems that may include a number of components, modules, and the like. It is to be understood and appreciated that the various systems may include additional components, modules, etc. and/or may not include all of the components, modules etc. discussed in connection with the figures. A combination of these approaches may also be used.

The various illustrative logical blocks, modules, and circuits that have been described may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor. The processor and the storage medium may reside in an ASIC. The ASIC may reside in the node, or elsewhere. In the alternative, the processor and the storage medium may reside as discrete components in the node, or elsewhere in an access network.

Figure 3:
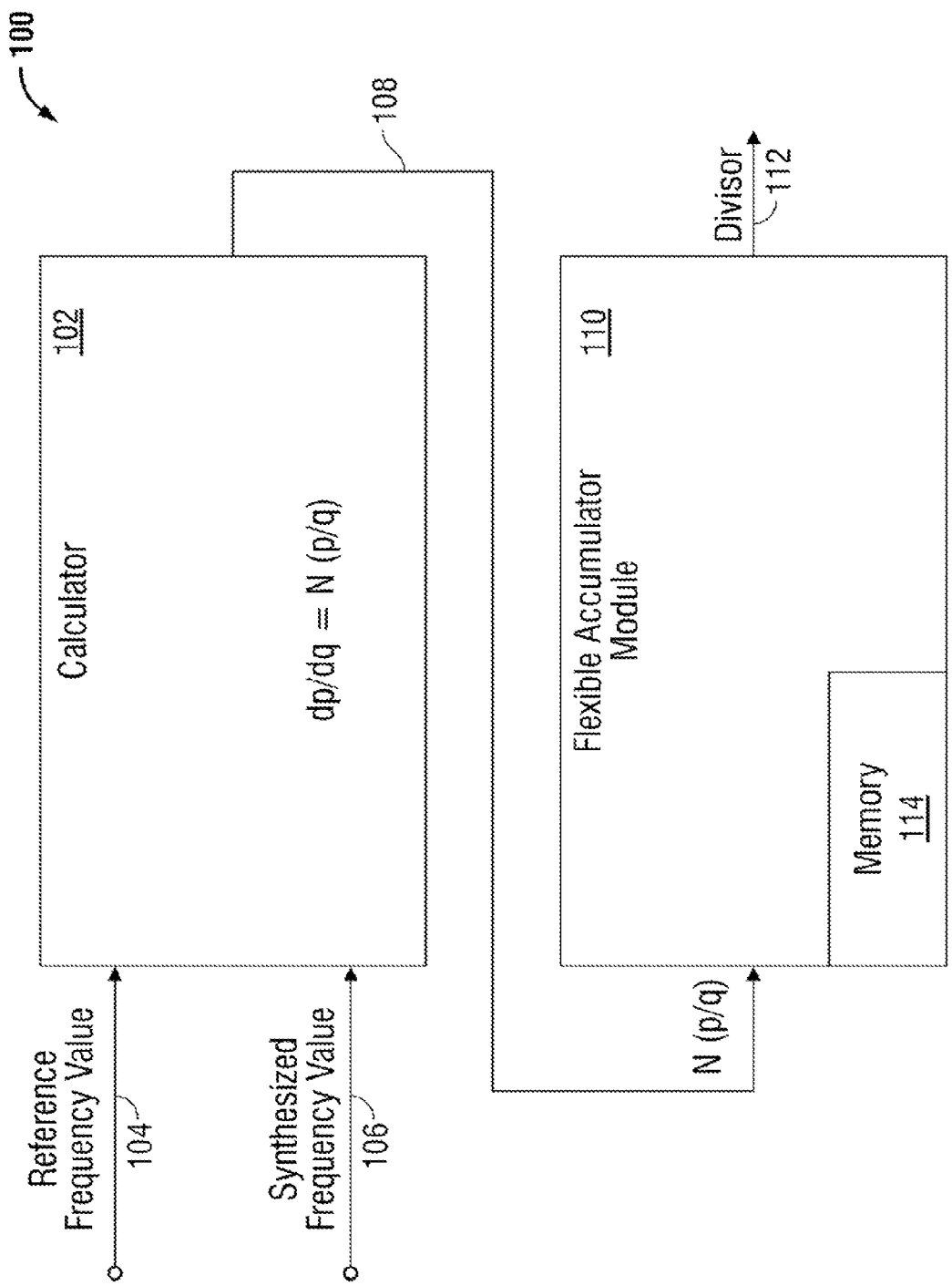
FIG. 3 is a schematic block diagram depicting a system for synthesizing signal frequencies using rational division.

FIG. 3 is a schematic block diagram depicting a system for synthesizing signal frequencies using rational division. The system 100 comprises a calculator 102 having an input on line 104 to accept a reference frequency value and an input on line 106 to accept a synthesized frequency value. The calculator 102 divides the synthesized frequency value by the reference frequency value, and determines an integer value numerator (dp) and an integer value denominator (dq). The calculator 102 reduces the ratio of dp/dq to an integer N and a ratio of p/q (dp/dq=N(p/q)), where p/q<1 (decimal). The calculator 102 supplies N(p/q), where p is a numerator and q is a denominator, at an output on line 108. A flexible accumulator module 110 has an input on line 108 to accept N(p/q) and an output on line 112 to supply a divisor. For example, the calculator 102 may supply an n-bit binary numerator and an (n+1)-bit binary denominator. The divisor may be stored in a tangible memory medium (e.g., random access memory (RAM) or non-volatile memory) for subsequent use, as described below. Note: in the context of FIGS. 10 through 13 described below, N(p/q)=I(N/D).

Figure 4:
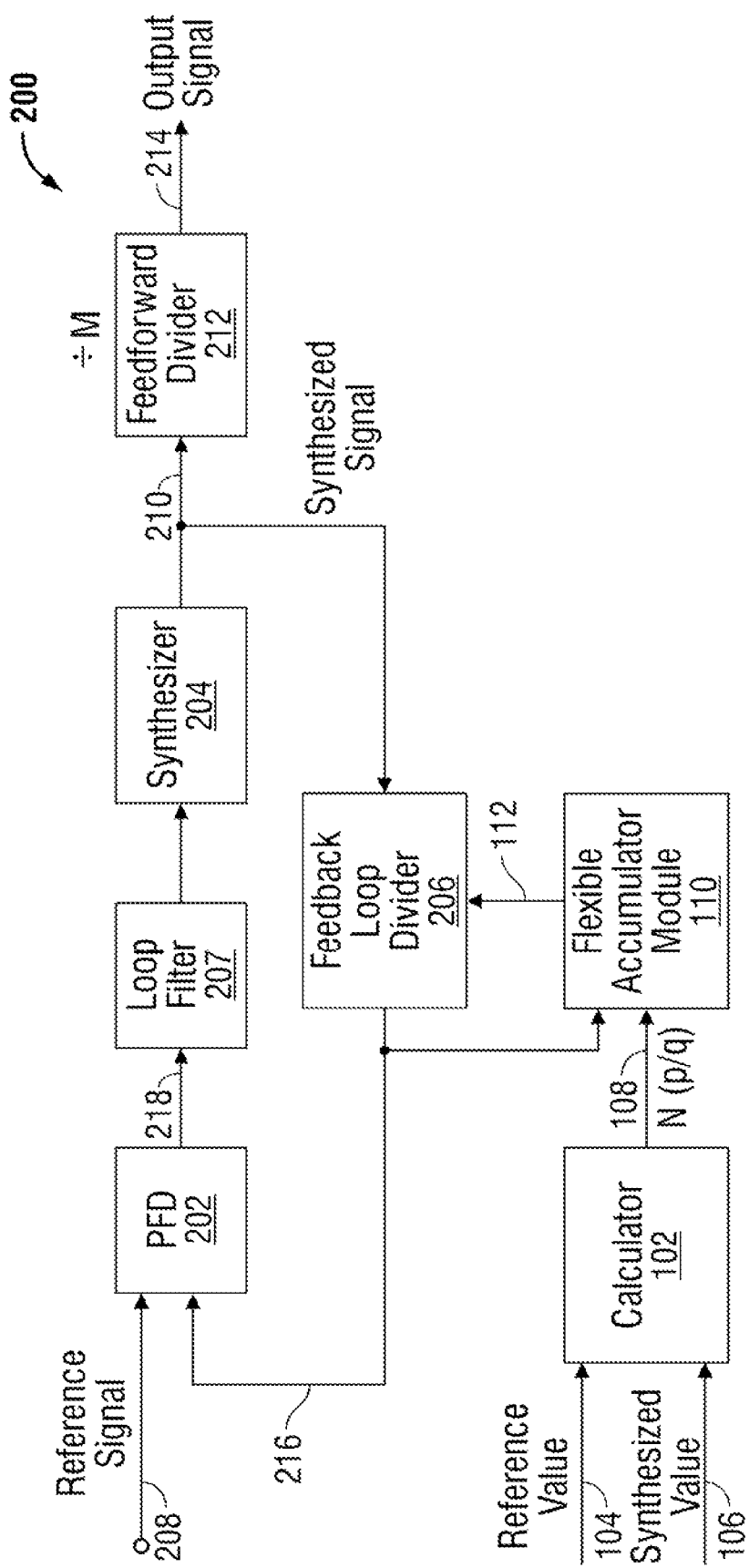
FIG. 4 is a schematic block diagram depicting the system of FIG. 3 is the context of a phase-locked loop (PLL).

FIG. 4 is a schematic block diagram depicting the system of FIG. 3 is the context of a phase-locked loop (PLL) 200. The PLL 200 includes a phase/frequency detector (PFD) 202, a frequency synthesizer 204, and a feedback loop divider 206. Typically, a PLL may also include a loop filer and charge pump 207. The PFD 202 accepts a reference signal on line 208 having a frequency equal to the reference frequency value. The frequency synthesizer 204 generates a synthesized signal on line 210 having a frequency equal to the synthesized frequency value. The flexible accumulator module 110 sums N with a k-bit quotient, creates the divisor, and supplies the divisor to the feedback loop divider 206 on line 112.

Figure 5:
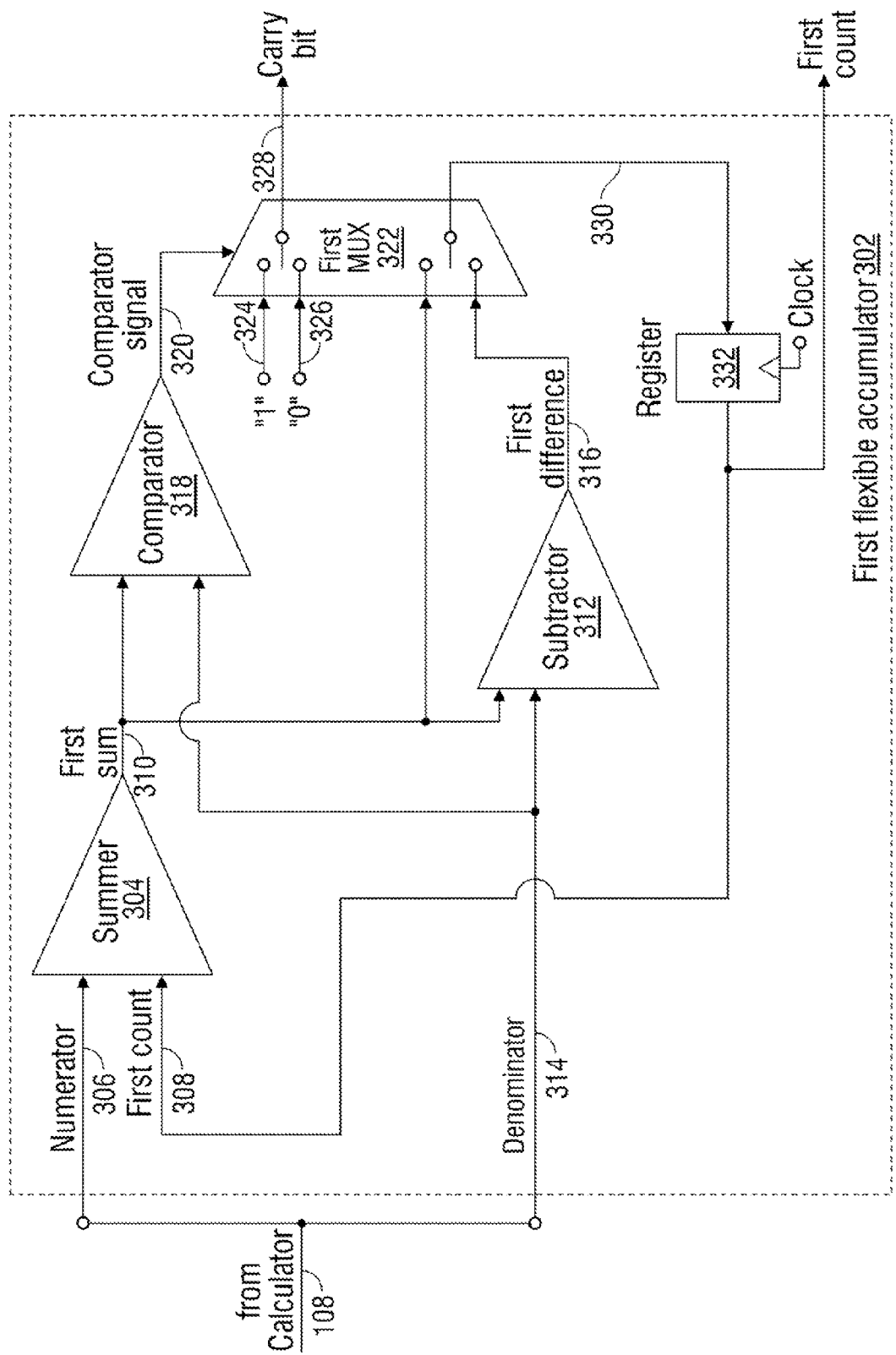
FIG. 5 is a schematic block diagram depicting a first flexible accumulator of the flexible accumulator module.

FIG. 5 is a schematic block diagram depicting a first flexible accumulator of the flexible accumulator module. A flexible accumulator is capable of either rational or fractional division. As explained in more detail below, rational division relies upon the use of a numerator (dividend) and a denominator (divisor) that are used to form a true rational number. That is, the numerator and denominator are integer inputs to the flexible accumulator. Alternately stated, the input need not be a quotient derived from a numerator and denominator. The first flexible accumulator 302 includes a first summer 304 having an input on line 306 to accept a binary numerator (p). Summer 304 has an input on line 308 to accept a binary first count from a previous cycle and an output on line 310 to supply a binary first sum of the numerator and the first count.

A first subtractor 312 has an input on line 314 to accept a binary denominator (q), an input on line 310 to accept the first sum, and an output on line 316 to supply a binary first difference between the first sum and the denominator. Note: the numerator (p) and denominator (q) on lines 306 and 314, respectively, are components of the information supplied by the calculator on line 108. A first comparator 318 has an input on line 310 to accept the first sum, an input on line 314 to accept the denominator, and an output on line 320 to supply a first comparator signal. A first multiplexer (MUX) 322 has an input to accept carry bits. A "1" carry bit is supplied on line 324 and a "0" carry bit is supplied on line 326. The MUX 322 has a control input on line 320 to accept the first comparator signal, and an output on line 328 to supply a first carry bit in response to the first comparator signal.

More explicitly, the first MUX 322 supplies a binary "1" first carry bit on line 328 if the first comparator signal on line 320 indicates that the first sum is greater than the denominator. The MUX 322 supplies a binary "0" first carry bit if the first comparator signal indicates that the first sum is less than or equal to the denominator. The first MUX 322 has an input on line 310 to accept the first sum, an input on line 316 to accept the first difference, and an output on line 330 to supply the first count in response to the comparator signal. Note: the first count from first MUX 322 on line 330 becomes the first count from a subsequent cycle on line 308 after passing through clocked register or delay circuit 332. As explained in more detail below, line 308 may also connected as an output port (count) to another, higher order flexible accumulator.

The first MUX 322 supplies the first difference as the first count on line 308 for the subsequent cycle if the first comparator signal indicates that the first sum is greater than the denominator. The first MUX 322 supplies the first sum as the first count in the subsequent cycle if the first comparator signal indicates that first sum is less than or equal to the denominator. Alternately but not shown, the accumulator may be comprised of two MUX devices, one for selecting the carry bit and one for selecting the first count.

In one aspect, the first summer accepts an n-bit binary numerator on line 306, an n-bit first count on line 308 from the previous cycle, and supplies an (n+1)-bit first sum on line 310. The first subtractor 312 accepts an (n+1)-bit binary denominator on line 314 and supplies an n-bit first difference on line 316.

Typically, first summer 304 accepts the numerator with a value, and the first subtractor 312 accepts the denominator with a value larger than the numerator value. In one aspect, the combination of the numerator and denominator form a rational number. That is, both the numerator and denominator are integers. However, the numerator and denominator need not necessarily form a rational number. Alternately expressed, the first summer 304 may accept an n-bit numerator that is a repeating sequence of binary values, or the numerator may be the most significant bits of a non-repeating sequence. The non-repeating sequence may be represented by r, an irrational number or a rational number that cannot be resolved (does not repeat) within a span of n bits. In this aspect, the first subtractor 312 accepts an (n+1)-bit denominator with a value equal to decimal $2^{(n+1)}$. Additional details of the flexible accumulator module can be found in parent application Ser. No. 11/954,325.

Figure 6:
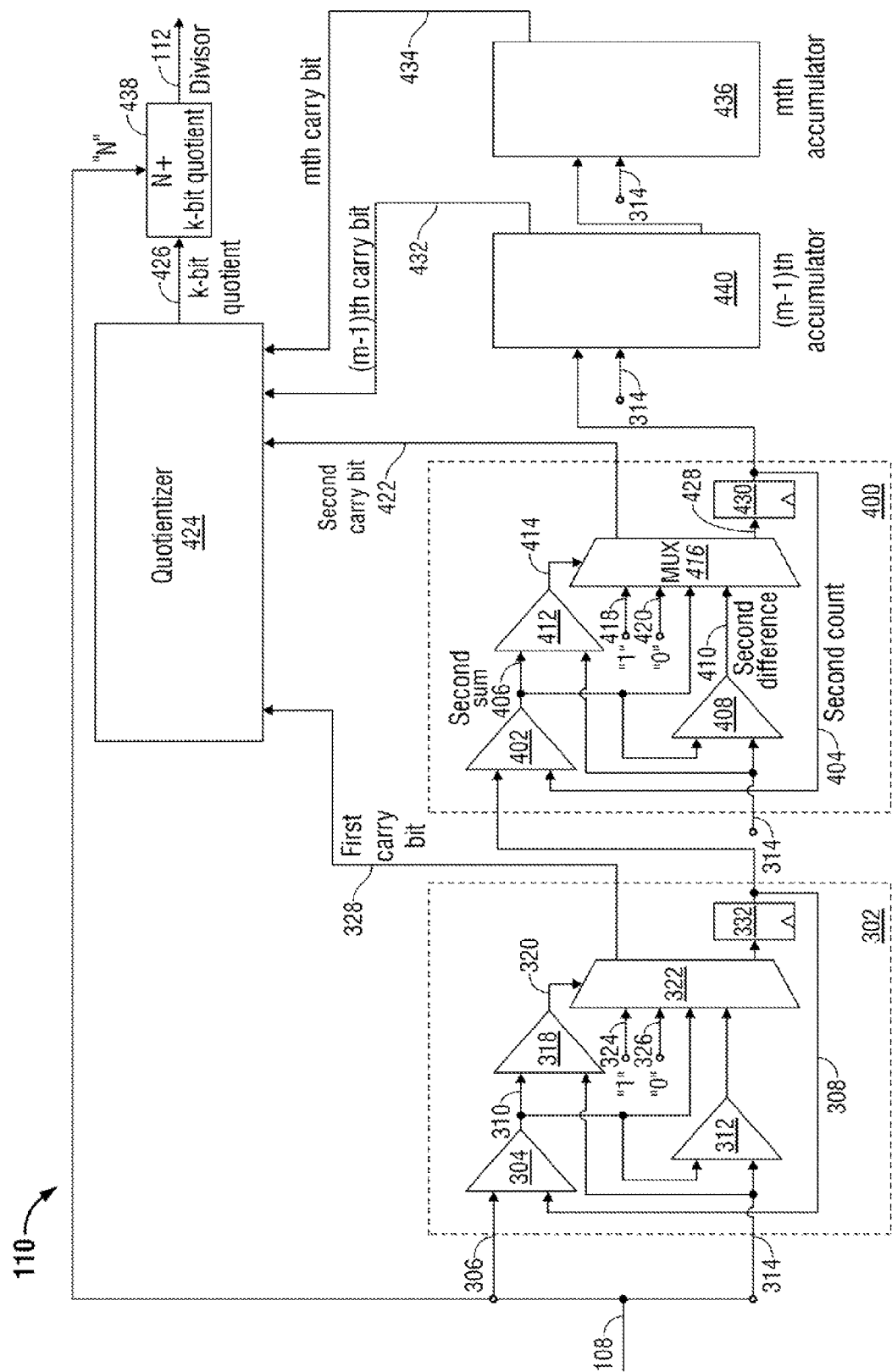
FIG. 6 is a schematic block diagram depicting the flexible accumulator module as a plurality of series-connected flexible accumulators.

FIG. 6 is a schematic block diagram depicting the flexible accumulator module as a plurality of series-connected flexible accumulators. Generally, the flexible accumulator module generates a binary sequence from each flexible accumulator and uses a plurality of binary sequences to generate the k-bit quotient.

A quotientizer 424 has an input on line 328 to accept the first binary sequence, an input on line 422 to accept the second binary sequence, and an output on line 426 to supply a k-bit quotient generated from the first and second binary sequences. In total, the flexible accumulator module 110 comprises m flexible accumulators, including an (m−1)th accumulator 440 and an mth accumulator 436. In this example, m=4. However, the module 110 is not limited to any particular number of flexible accumulators. Thus, the quotientizer has inputs 328, 422, 432, and 434 to accept m=4 binary sequences and the output 426 supplies a k-bit quotient generated from the m binary sequences. In one aspect, the quotientizer 424 derives the quotient as shown in FIGS. 1 and 2, and as explained below. Circuit 438 sums the k-bit quotient on line 426 with the integer N to supply the divisor on line 112.

A fourth order system, using four series-connected accumulators has been depicted as an example. However, it should be understood that the system is not limited to any particular number of accumulators. Although the above-described values have been defined as binary values, the system could alternately be explained in the context of hexadecimal or decimal numbers.

Figure 7:
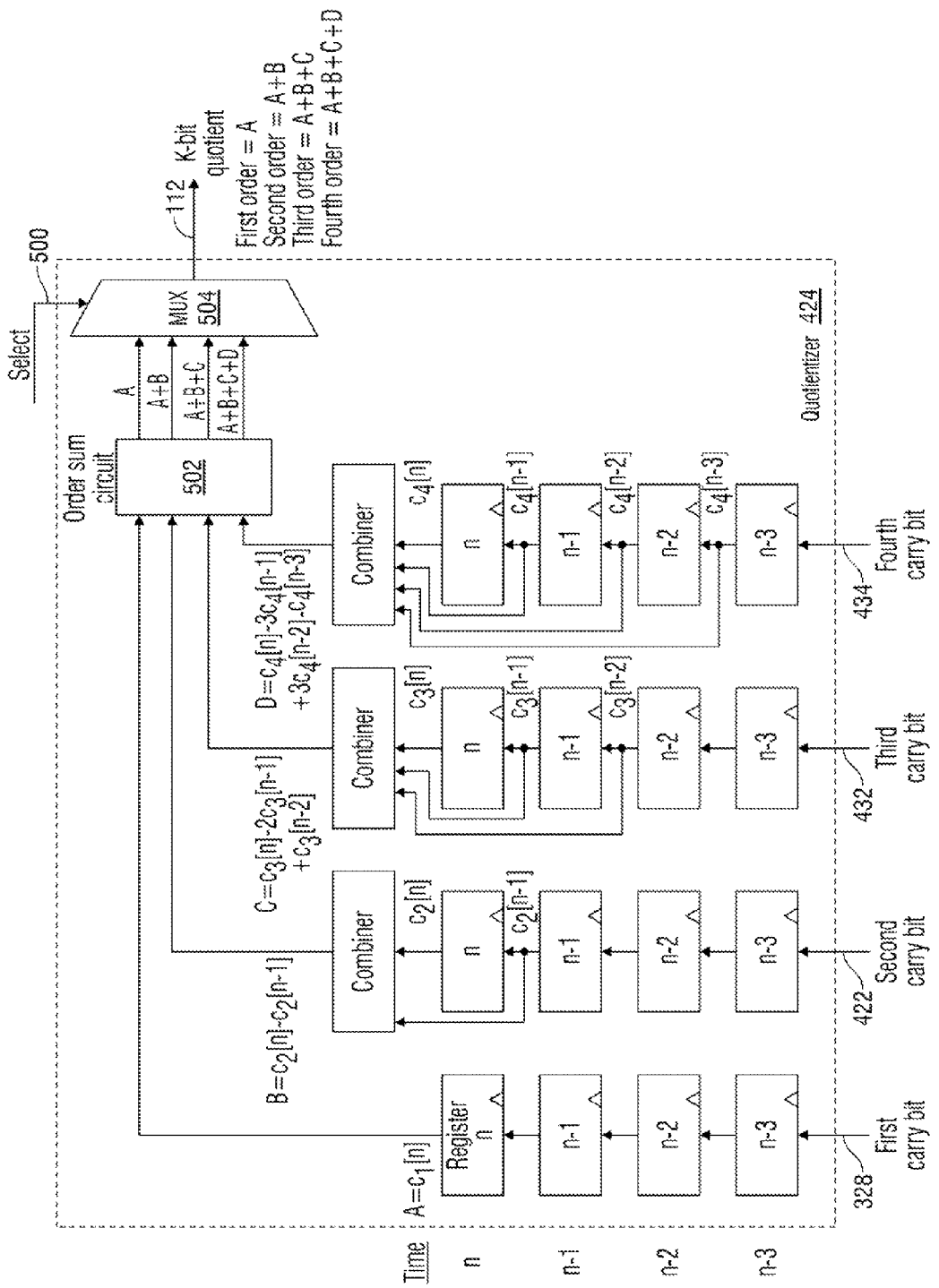
FIG. 7 is a schematic block diagram depicting the quotientizer of FIG. 6 in greater detail.

FIG. 7 is a schematic block diagram depicting the quotientizer of FIG. 6 in greater detail. Returning to the calculation of the quotient, the number of bits required from each contribution block is different. From FIG. 2 it can see that each order requires a different number of bits. For example, the first contribution (contribution1) has only two values: 0 and 1. So, only 1 bit is needed. There is no need for a sign bit, as the value is always positive. The second contribution has possible 4 values: −1, 0, 1, and 2. So, 3 bits are needed, including 1 sign bit. The third contribution has 7 values: −3 to 4. So, 4 bits are required, including 1 sign bit. The fourth contribution has 15 values: −7 to 8. So, 5 bits are required, including 1 sign bit.

To generalize for "k" (the k-bit quotient), Pascal's formula may be used to explain how many bits is necessary for each contribution (or order). For an m-order calculator, there are m flexible accumulators and m binary sequences. Each binary sequence (or carry bit) is connected to the input of one of the m sequences of shift registers. Thus, there are m signals combined from the m shift register sequences, corresponding to the m-binary sequences (or m-th carry bit) found using Pascal's formula. A 4-order calculator is shown in FIG. 7, with 4 shift register (delay) sequences, with each shift register sequence including 4 shift registers.

As a simplified alternative, each contribution may be comprised of the same number of bits, k, which is the total contribution (or order) for all contributions. These k-bit contributions are 2 complement numbers. In FIG. 2, k is equal to 5 bits [4:0].

The accumulator does not generate a sign bit. However, the carry outs from the accumulators are modulated in the calculator and the sign bit is generated. For example, the $2^{nd}$ order contribution=c2[n]−c2[n−1]. If c2[n]=0 and c2[n−1]=1, then the $2^{nd}$ order contribution=0−1=−1. Similarly, the third order contribution=c3[n]−2c3[n−1]+c3[n−2]. If c3[n]=0, c3[n−1]=1, and c3[n−2]=0, then the $3^{rd}$ order contribution=0−2×1+0=−2. For the $4^{th}$ order contribution=c4[n]−3c4[n−1]+3c4[n−2]−c4[n−3]. If c4[n]=0, c4[n−1]=1, c4[n−2]=0, and c4[n−3]=1, then the $4^{th}$ order contribution=0−3×1+3×0−1=−4. These contributions are added together in the "order sum circuit" 502 on the basis of order, and the order is chosen using MUX 504 and the select signal on line 500. FIG. 7 depicts one device and method for generating a quotient from accumulator carry bits. However, the system of FIG. 6 might also be enabled using a quotientizer that manipulates the accumulator carry bits in an alternate methodology.

Returning to FIG. 4, in one aspect the calculator 102 defines a resolution limit of j radix places, sets q=dq, and determines p. The calculator 102 supplies p and q to a flexible accumulator module 110 enabled for rational division when p can be represented as an integer using j, or less, radix places. Alternately, the calculator 102 supplies N(r/q) to a flexible accumulator module enabled for fractional division, where r is a non-resolvable number, when p cannot be represented as an integer using j radix places. When enabled for fractional division, r is supplied as the "numerator" on line 306 (see FIG. 5). Then, the "denominator" on line 314 is represented as an integer with a value larger than the fractional number. For example, the fractional number of line 306 may be an unresolved 31-bit binary number and the integer on line 314 may be a 32-bit number where the highest order radix place is "1" and all the lower orders are "0". Alternately stated, r may be a 31-bit non-resolvable numerator, and q a 32-bit denominator with a value equal to decimal $2^{32}$. In one aspect, r is "rounded-off" to a resolvable value.

In one aspect, the PLL 200 of FIG. 4 includes a feedforward divider 212 to accept the synthesized signal on line 210 and an output on line 214 to supply an output signal having a frequency=(synthesized signal frequency)/M. In this aspect, the flexible accumulator module 110 creates the divisor by summing N, the k-bit quotient, and M. Likewise, the calculator 102 reduces to ratio M(dp/dq)=N(p/q)).

Figure 8:
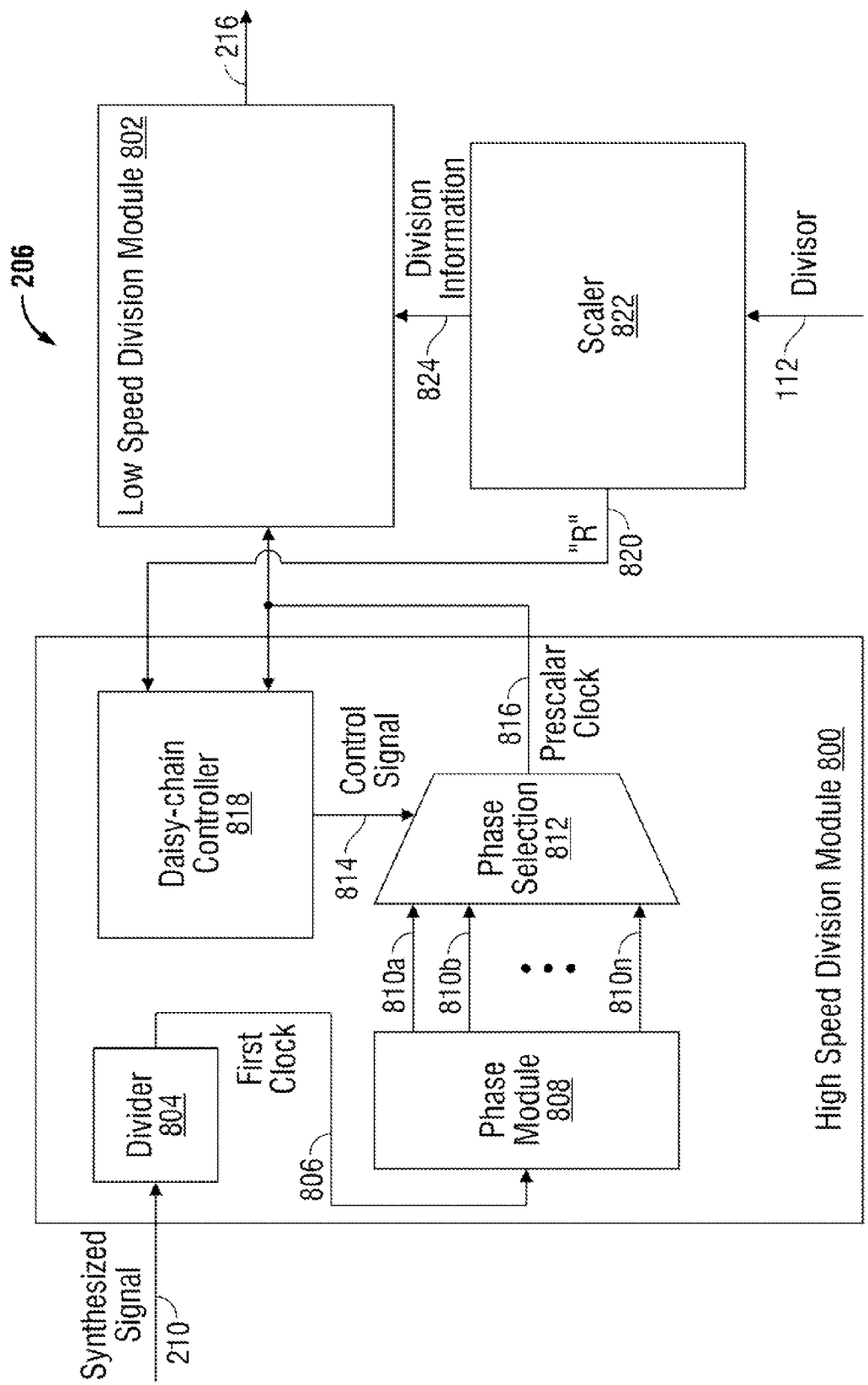
FIG. 8 is a schematic block diagram depicting the feedback loop divider of FIG. 4 is greater detail.

FIG. 8 is a schematic block diagram depicting the feedback loop divider of FIG. 4 in greater detail. The feedback loop divider 206 includes a high-speed division module 800 and a low-speed division module 802. The high-speed module 800 includes a divider 804 having an input on line 210 to accept the synthesized signal and an output on line 806 to supply a first clock signal having a frequency equal to the (synthesized signal frequency)/J. A phase module 808 has an input on line 806 to accept the first clock and an output on lines 810a through 810n to supply a plurality of phase outputs, each having the first clock frequency. Typically, the phase module 808 generates a first clock with a first number of equally-spaced phase outputs. For example, n may be equal to 8, meaning that 8 first clock signals are supplied, offset from the nearest adjacent phase by 45 degrees. A phase selection multiplexer 812 has an input on lines 810a-810n to accept the plurality of first clock phase outputs, an input on line 814 to accept a control signal for selecting a first clock signal phase, and an output on line 816 to supply a prescalar clock with a frequency equal to the (synthesized signal frequency)/R, where R=J·S.

A daisy-chain register controller 818 has an input on line 820 to accept the pre-divisor value R and an output on line 814 to supply the control signal for selecting the first clock phase outputs. A low-speed module 822 has an input on line 816 to accept the prescalar clock and an output on line 216 to supply a divided prescalar clock with a frequency equal to the (divisor/R). A scaler 822 accepts the divisor on line 112, supplies the R value of line 820, and supplies division information to the low speed divider 802 on line 824. Returning briefly to FIG. 4, the PFD 202 compares the divided prescalar clock frequency on line 216 to the reference clock frequency and generates a synthesized signal correction voltage on line 218. In some aspects, the divided prescalar clock signal on line 216 is feedback to the flexible accumulator module 110.

Figure 9:
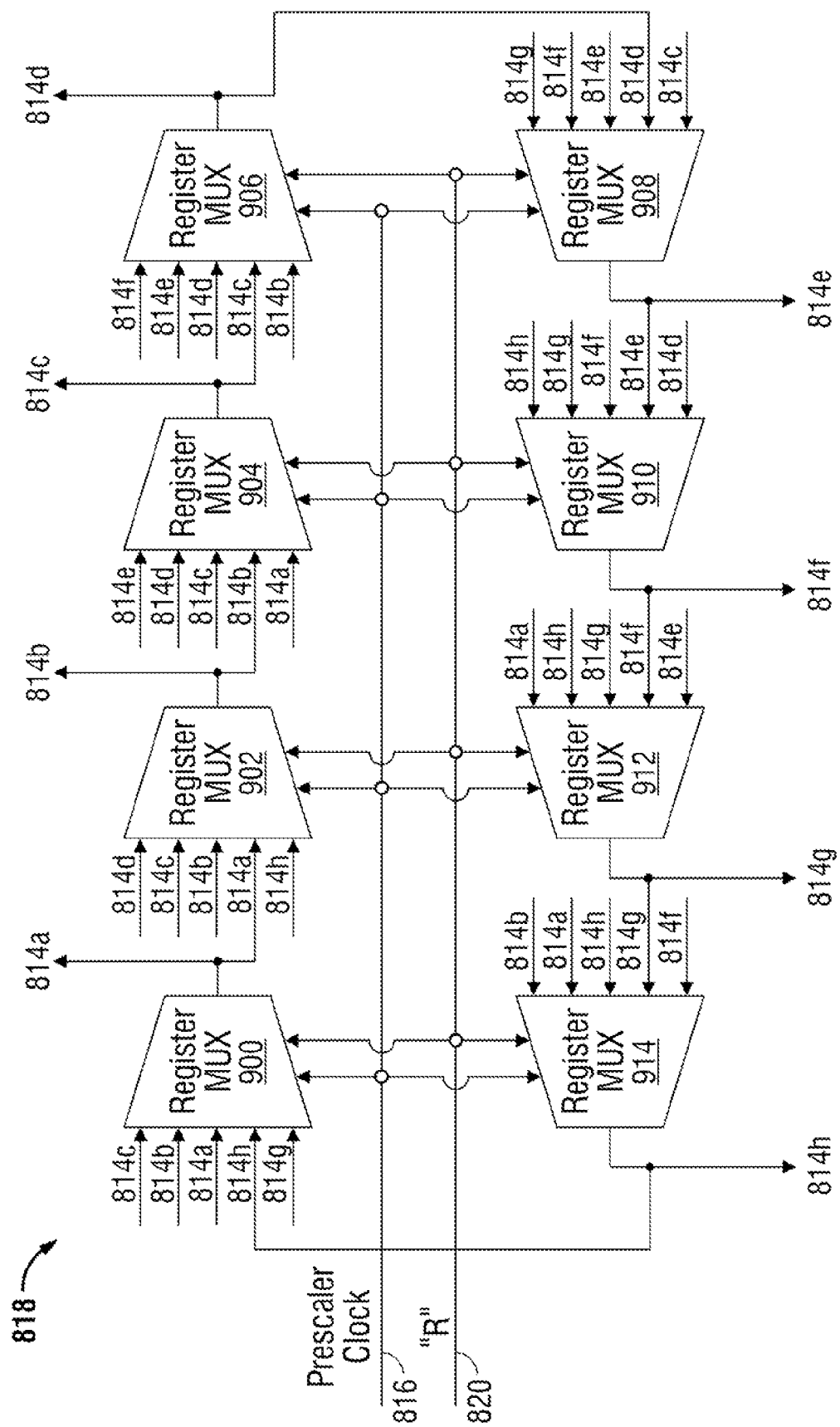
FIG. 9 is a block diagram depicting the daisy-chain controller of FIG. 8 in greater detail.

FIG. 9 is a block diagram depicting the daisy-chain controller of FIG. 8 in greater detail. The daisy-chain register controller 818 accepts the prescalar clock on line 816 as a clock signal to registers 900 through 914 having outputs connected in a daisy-chain. The controller 818 generates a sequence of register output pulses 814a through 814h in response to the clock signals, and uses the generated register output pulses to select the first clock phase outputs.

The daisy-chain register controller 818 iteratively selects sequences of register output pulses until a first pattern of register output pulses is generated. Then, the phase selection multiplexer (816, see FIG. 8) supplies phase output pulses having a non-varying first period, generating a prescalar clock frequency equal to the (first clock frequency)·S, where S is either an integer or non-integer number. Additional details of the high speed divider and daisy-chain controller may be found in parent application Ser. No. 11/717,261.

Figure 10:
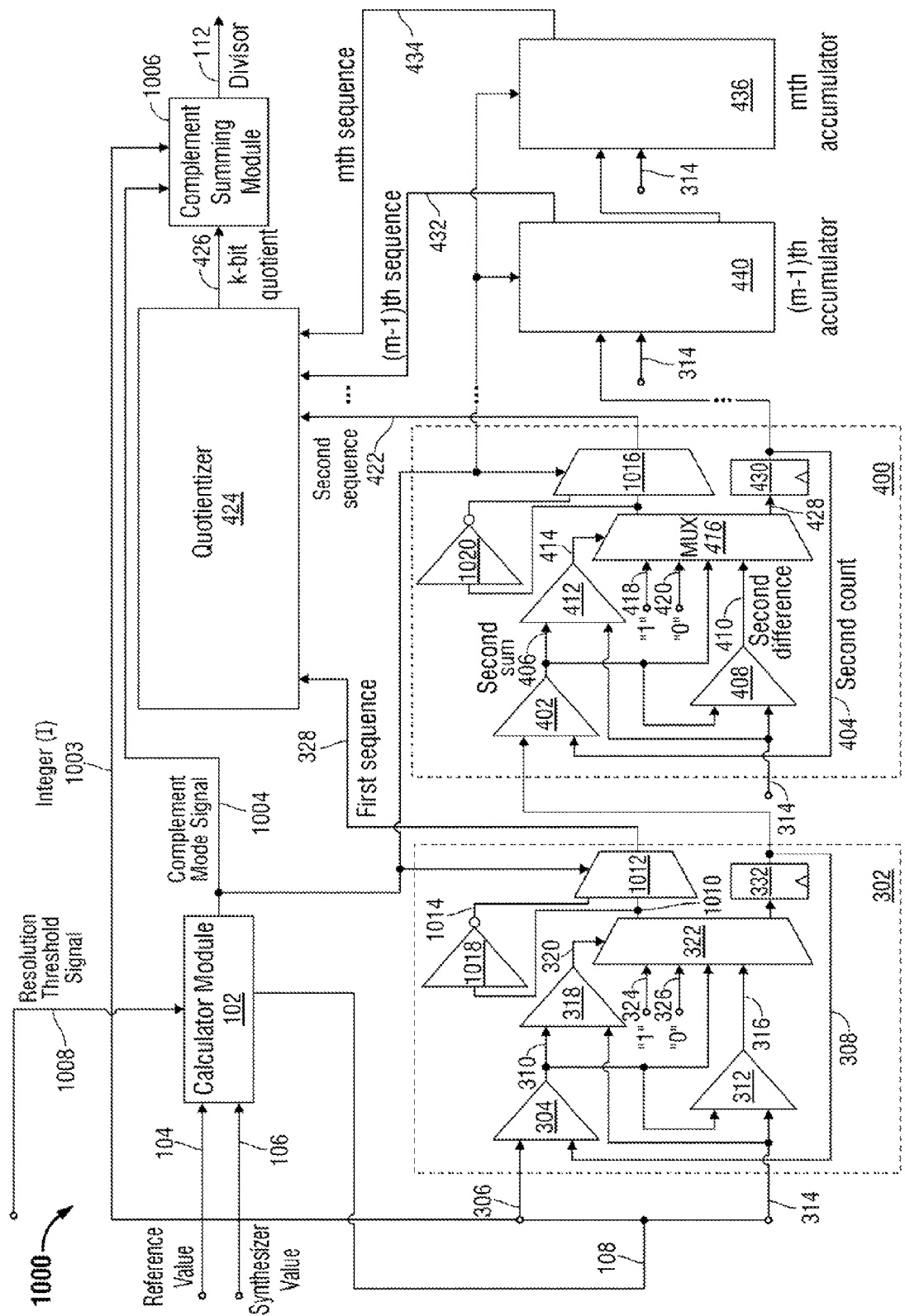
FIG. 10 is a schematic block diagram of a device for synthesizing signal frequencies using low resolution rational division.

FIG. 10 is a schematic block diagram of a device for synthesizing signal frequencies using low resolution rational division. The device 1000 comprises a calculator module or calculator 102 having inputs to accept a reference frequency value on line 104 and a synthesized frequency value on line 106. The calculator module 102 divides the synthesized frequency value by the reference frequency value and determines an integer value numerator (n) and an integer value denominator (d). The calculator module 102 reduces the ratio of n/d to an integer (I) and a ratio of N/D, where n/d=I(N/D)=I+N/D=(I+1)−(D−N)/D), and where N/D<1. In one aspect, N and D are integers. The calculator module 102 has an output on line 108 to supply a low resolution ratio and the integer. More explicitly, line 108 is separated into different lines, with the numerator supplied on line 306, the denominator on line 314, and the integer on line 1003. As explained in more detail below, the numerator on line 306 may either be N, or if the resolution of N is too great, (D−N). The calculator module 102 also has an output to supply a complement mode (or non-complement mode) signal on line 1004.

A first flexible accumulator 302 has an input on lines 306 and 314 to accept the low resolution ratio and an input on line 1004 to accept the complement mode signal. In the low resolution or complement mode, the first flexible accumulator 302 creates a binary first sum on line 310, of (D−N) on line 306 (the numerator) and a binary first count from a previous cycle on line 308. The first flexible accumulator creates a binary first difference on line 316 between the first sum on line 310 and the denominator on line 314. Comparator 318 compares the first sum on line 310 with the denominator on line 314, and a first carry bit is generated in response to the comparing. In response to the complement mode signal on line 1004, the complement of the first carry bit is added to a first binary sequence on line 328. A quotientizer 424 has an input on line 328 to accept the first binary sequence and an output on line 426 to supply a k-bit quotient.

A complement summing module 1006 has an input on line 426 to accept the k-bit quotient, an input on line 1003 to accept the integer, and an input on line 1004 to accept the complement mode signal. The complement summing module 1006 subtracts the k-bit quotient from (I+1) to supply a divisor at an output on line 112, in response to the complement mode signal on line 1004.

In one aspect, the calculator module 102 has an input on line 1008 to accept a resolution signal for establishing a resolution threshold of X bits. The calculator module 102 supplies the complement mode signal on line 1004 in response to the numerator being resolved with greater than X bits. In contrast, the calculator module 102 supplies a non-complement mode signal on line 1004 in response to the numerator being resolved with X, or fewer bits. In the non-complement mode, the low resolution ratio is N instead of (D−N). That is, N is the numerator instead of (D−N). The first flexible accumulator 302 creates a binary first sum on line 310 of N (line 306) and the binary first count from a previous cycle on line 308, and adds the first carry bit to the first binary sequence on line 328 in response to the non-complement signal. The complement summing module 1006 adds the k-bit quotient on line 426 to I (line 1003), to generate the divisor on line 112, in response to the non-complement signal. In the non-complement mode, the low resolution rational division device 1000 operates essential the same as the system described in FIG. 6, above.

Figure 11:
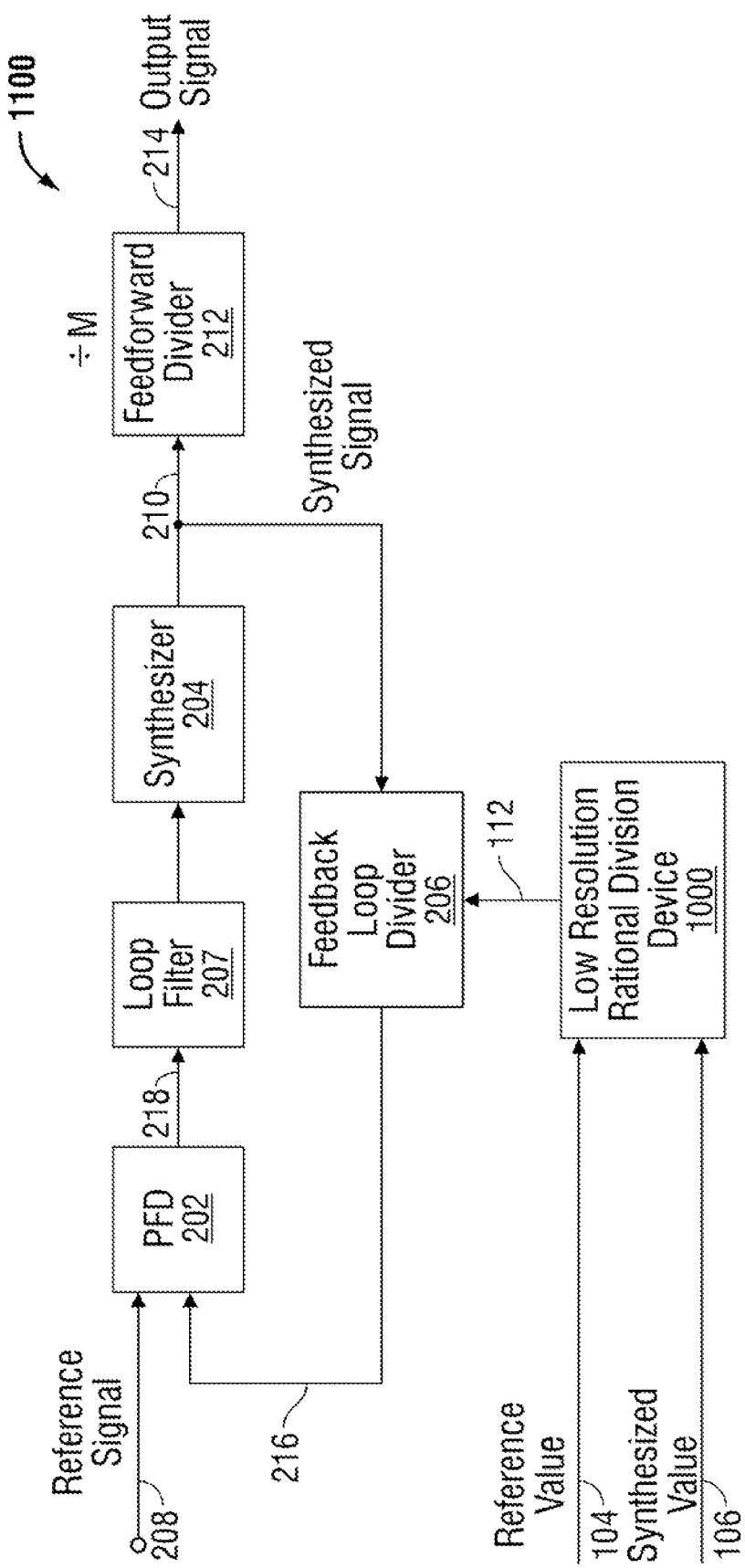
FIG. 11 is a schematic block diagram of a phase-locked loop (PLL) using the low resolution rational decision device of FIG. 10.

FIG. 11 is a schematic block diagram of a phase-locked loop (PLL) using the low resolution rational division device 1000 of FIG. 10. The PLL 1100 includes a phase/frequency detector (PFD) 202, frequency synthesizer 204, and feedback loop divider 206. The PFD 202 accepts a reference signal on line 208 having a frequency equal to the reference frequency value. The frequency synthesizer 204 generates a synthesized signal on line 210 having a frequency nominally equal to the synthesized frequency value on line 106. The feedback loop divider 206 has an input on line 210 to accept the synthesized signal and an input on line 112 to accept the divisor. The feedback loop divider 206 divides the synthesizer signal on line 210 by the divisor on line 112 (I+N/D=(I+1)−(D−N)/D) to supply a clock signal on line 216. The PFD 202 compares the clock signal frequency to the reference frequency on line 208, and in response to the comparison, locks the synthesizer signal on line 210 to the reference signal on line 208.

Returning to FIG. 10, the first flexible accumulator 302 includes a first summer 304 having an input to accept a binary numerator (N or (D−N)), an input on line 308 to accept the first count from a previous cycle, and an output on line 310 to supply the first sum of the numerator and the first count. A first subtractor 312 has an input on line 314 to accept a binary denominator, and input on line 310 to accept the first sum, and an output on line 316 to supply the first difference between the first sum and the denominator. A first comparator 318 has an input on line 310 to accept the first sum, an input on line 314 to accept the denominator, and an output on line 320 to supply a first comparator signal. A first multiplexer (MUX) 322 has an input to accept carry bits ("0" on line 324 and "1" on line 326), a control input on line 320 to accept the first comparator signal, and an output on line 1010 to supply the first carry bit in response to the first comparator signal. A second MUX 1012 has an input on line 1010 to accept the first carry bit, an input on line 1014 to accept the complement of the first carry bit, and a control input on line 1004 to accept the complement mode (or non-complement mode) signal. The second MUX 1012 adds the complement of the first carry bit to the first binary sequence on line 328 in response to a complement mode signal on line 1004, or adds the first carry bit to the first binary sequence in response to the non-complement signal on line 1004.

As in the first flexible accumulator described above in the explanation of FIG. 5, the first flexible accumulator 302 generates a binary "1" first carry bit if the first sum is greater than the denominator, or generates a binary "0" first carry bit if the first sum is less than or equal to the denominator. The first flexible accumulator 302 uses the first difference as the first count if the first sum is greater than the denominator, or uses the first sum as the first count if the first sum is less than or equal to the denominator.

The calculator module 102 generates an n-bit binary numerator on line 306 and an (n+1)-bit binary denominator on line 314. The n-bit numerator (N or (D−N)) is resolved with X or fewer bits. The first flexible accumulator 302 creates an (n+1)-bit first sum of the numerator on line 310, an n-bit first count from the previous cycle on line 308, and an n-bit first difference on line 316.

Typically, the device 1000 includes a plurality of flexible accumulators. Shown is a chain of (m−1) flexible accumulators 400, 436, and 440, linked to the first flexible accumulator 302. "m" is a variable integer not limited to any particular value. Each ith flexible accumulator in the chain accepts an (ith−1) count from a previous cycle and an ith count from the previous cycle. Each ith flexible accumulator creates a binary ith sum of the (ith−1) count and the ith count, creates a binary ith difference between ith sum and the denominator, and compares the ith sum with the denominator. If the ith sum is greater than the denominator, a binary "1" ith carry bit is generated and the ith difference is used as the ith count for a subsequent cycle. If the ith sum is less than or equal to the denominator, a binary "0" ith carry bit is generated and the ith sum is used as the ith count for the subsequent cycle. Finally, either the ith carry bit or the complement of the ith carry bit is added to the ith binary sequence, depending upon whether a complement mode or non-complement mode signal is received. The quotientizer 424 accepts m iteratively generated binary sequences and uses the m binary sequences to generate the k-bit quotient.

Figure 12:
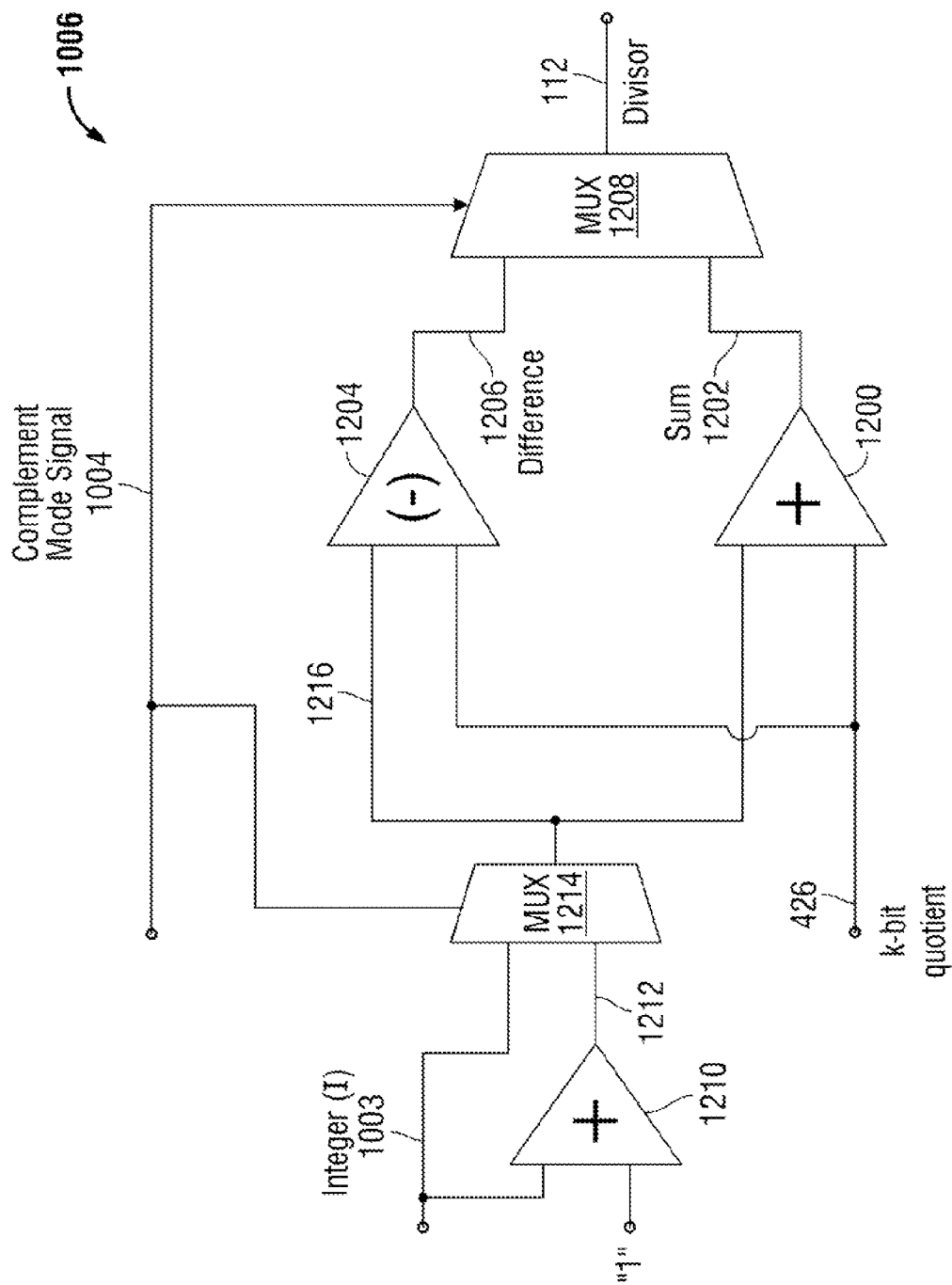
FIG. 12 is a more detailed depiction of the complement summing module of FIG. 10.

FIG. 12 is a more detailed depiction of the complement summing module of FIG. 10. A summing module 1210 accepts the integer (I) on line 1003, sums integer (I) with "1", and supplies the sum (I+1) on line 1212. MUX 1214 selects between line 1212 (I+1) and line 1003 (I) in response to the complement mode signal on line 1004, and supplies the output on line 1216. Summing module 1200 accepts the integer selection on line 1216, and the k-bit quotient on line 426, and supplies a sum of the 2 inputs on line 1202. A subtraction module 1204 accepts the integer selection on line 1216, and the kbit quotient on line 426, and supplies a difference the 2 inputs on line 1206. MUX 1208 accepts the sum and difference and supplies one of the 2 inputs as the divisor on line 112, in response to the complement mode signal on line 1004.

Figure 13:
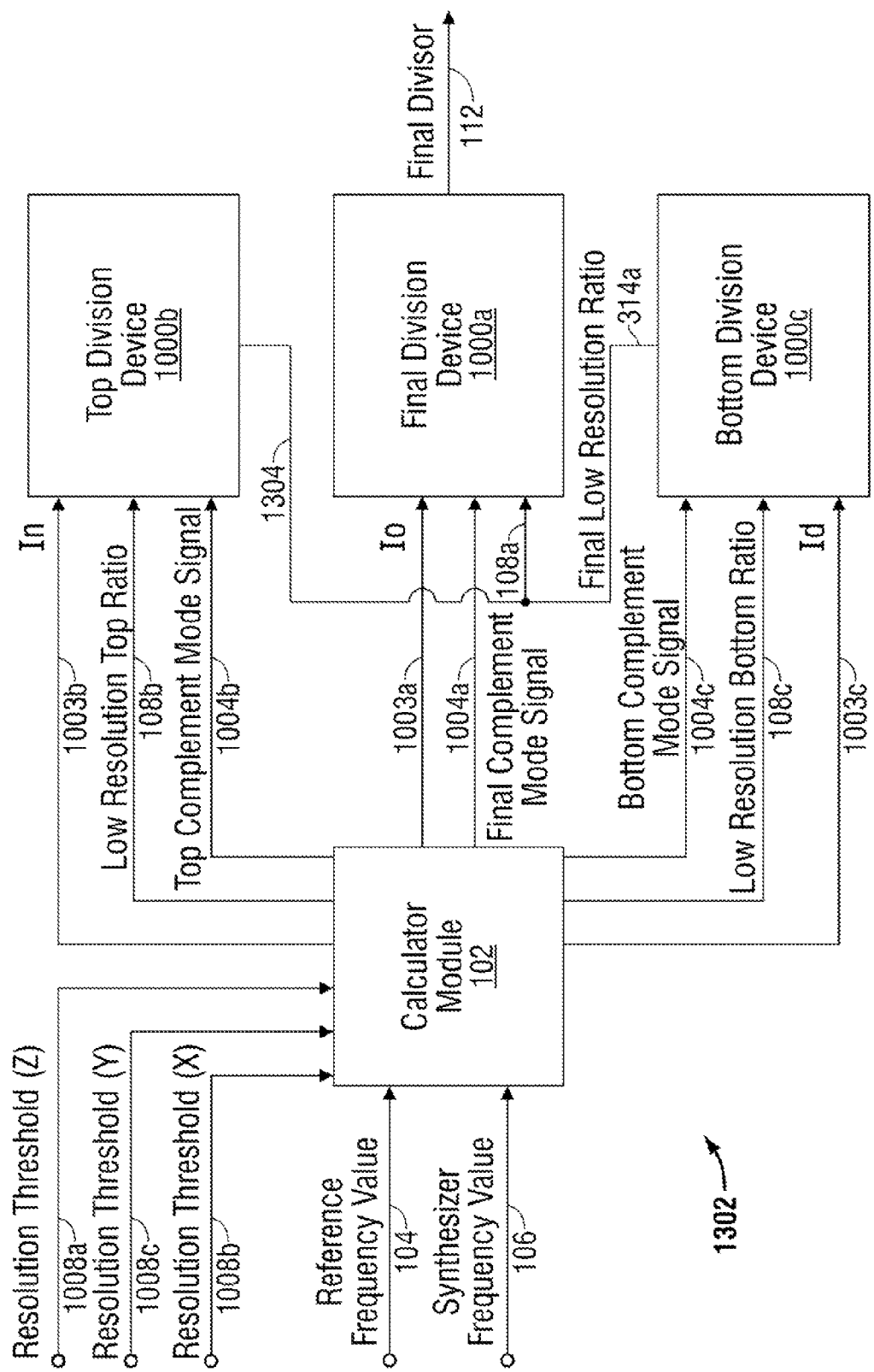
FIG. 13 is a schematic block diagram of a frequency synthesis device with a system for synthesizing signal frequencies using low resolution rational division decomposition.

FIG. 13 is a schematic block diagram of a frequency synthesis device 1300 with a system for synthesizing signal frequencies using low resolution rational division decomposition. The system 1302 comprises a calculator module 102 having an input on line 106 to accept a reference frequency value and an input on line 104 to accept a synthesized frequency value. The calculator module 102 determines an integer value numerator (n) and an integer value denominator (d) in response to dividing the synthesized frequency value by the reference frequency value. The calculator module 102 reduces the ratio of n/d as follows: $n/d = I_O(N_O/D_O) = I_O + N_O/D_O = (I_O+1) - (D_O-N_O)/D_O$, and where $N_O/D_O < 1$ and $N_O$ and $D_O$ are integers. The calculator module 102 reduces $N_O$ as follows: $N_O = I_n(N_n/D_n) = I_n + N_n/D_n = (I_n+1) - (D_n-N_n)/D_n$, where $I_n$, $N_n$, and $D_n$ are integers, and $N_n/D_n < 1$, and reduces $D_O$ as follows: $D_O = I_d(N_d/D_d) = I_d + N_d/D_d = (I_d+1) - (D_d-N_d)/D_d$, where $I_d$, $N_d$, and $D_d$ are integers, and $N_d/D_d < 1$.

The calculator module 102 has an output on line 1003a to supply the integer $I_O$, an output on line 1003b to supply integer $I_n$, and an output on line 1003c to supply integer $I_d$. The calculator module 102 supplies a low resolution top ratio on line 108b, a low resolution bottom ratio on line 108c, a final complement mode signal on line 1004a, a top complement mode signal on line 1004b, and a bottom complement mode signal on line 1004c.

A top division device 1000b has an input on line 1003b to accept $I_n$, an input on line 108b to accept a the top low resolution ratio, and an input on line 1004b to accept the top complement mode signal. The top division device 1000b has an output to supply a final numerator divisor on line 1304. A bottom division device 1000c has an input on line 1003c to accept $I_d$, an input to accept the bottom low resolution ratio on line 108c, and the bottom complement mode signal on line 1004c. The bottom division device 1000c has an output to supply a final denominator divisor on line 314a. A final division device 1000a has an input on line 1003a to accept $I_O$, an input on line 108a to accept a final low resolution ratio, and an input on line 1004a to accept the final complement mode signal. The final division device 1000a has an output on line 112 to supply a final divisor.

Figure 14A:
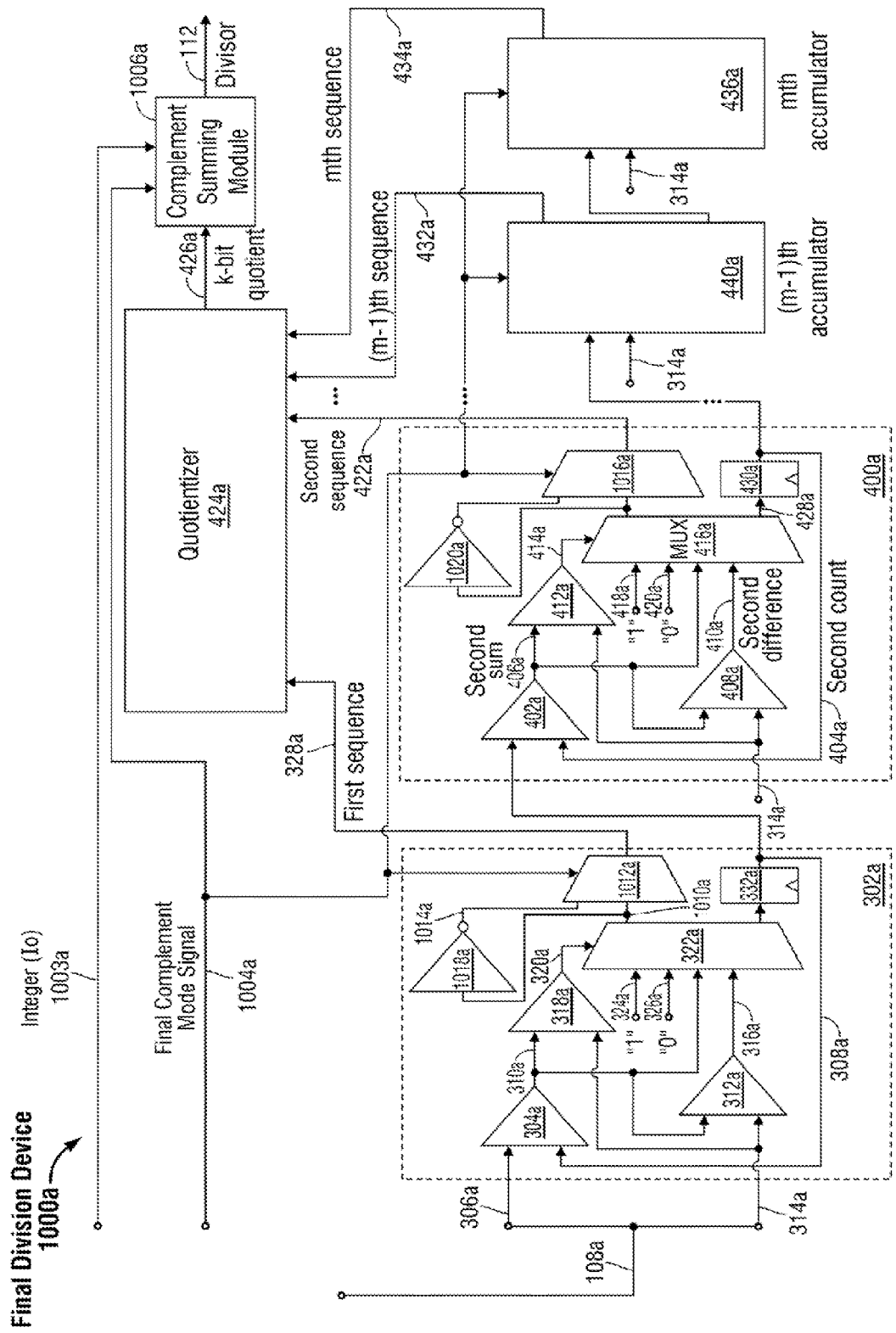
FIGS. 14A, 14B, and 14C are more detailed depictions of, respectively, the final, top, and bottom division devices of FIG. 13.
Figure 14B:
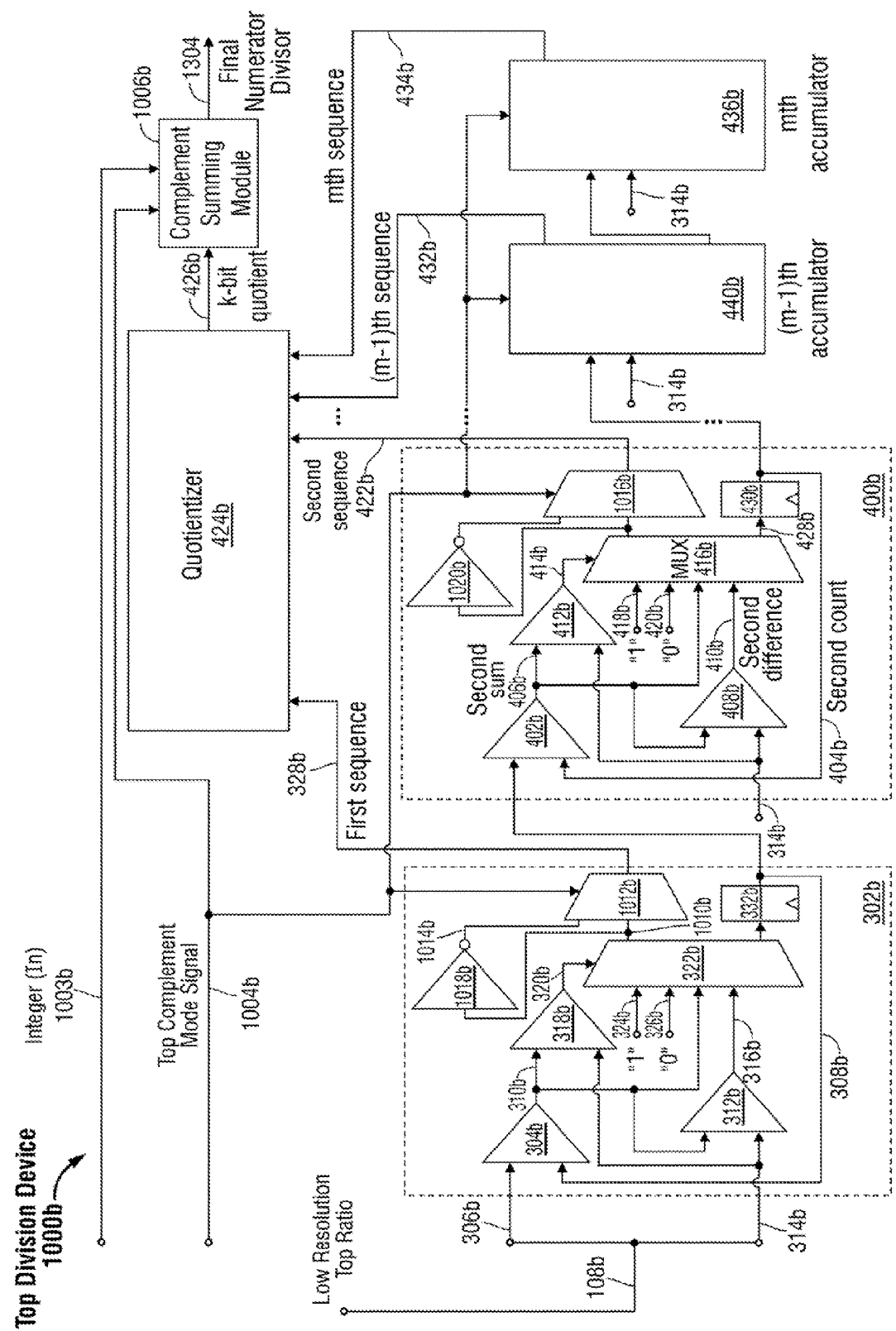
Figure 14C:
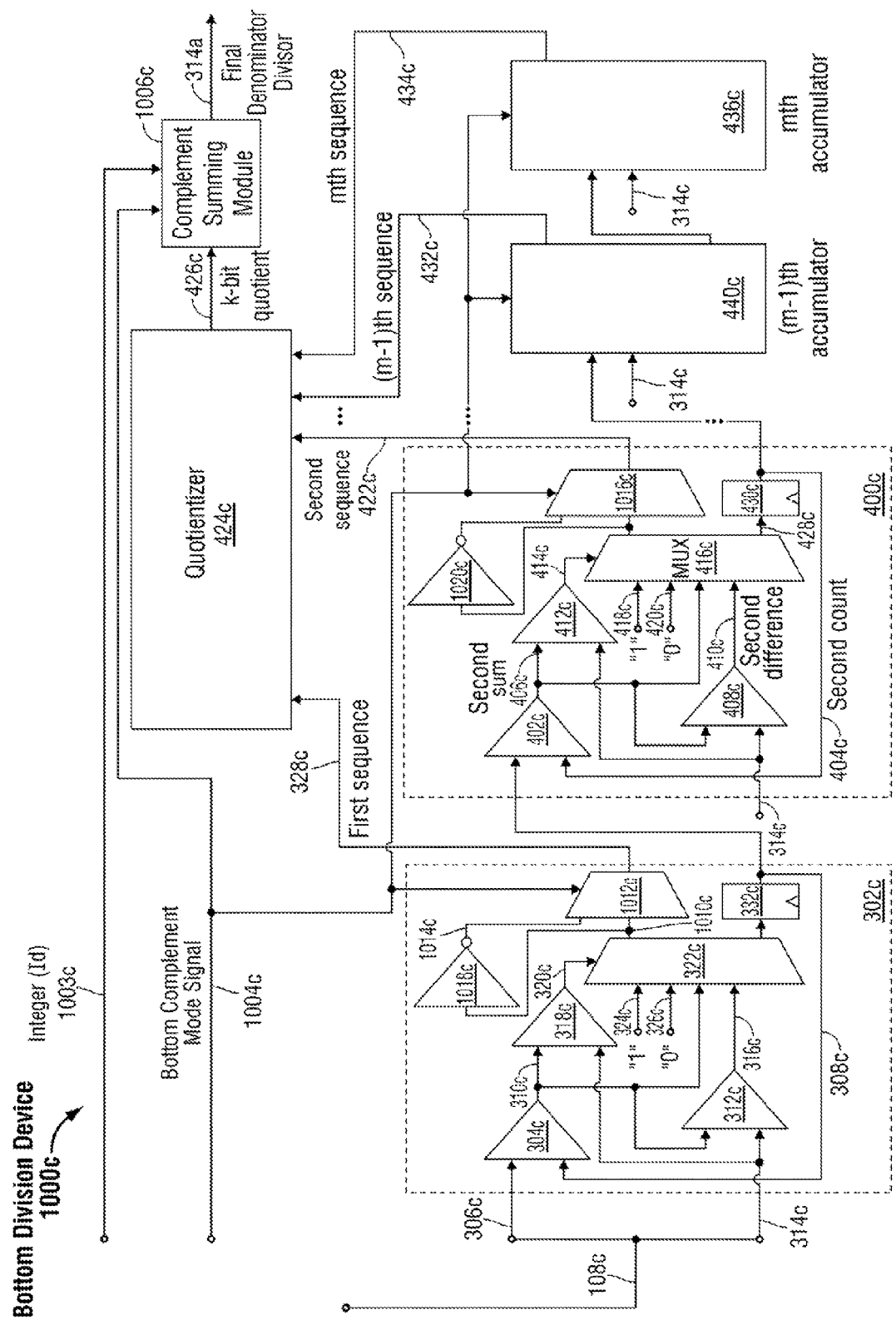

FIGS. 14A, 14B, and 14C are more detailed depictions of, respectively, the final, top, and bottom division devices of FIG. 13. It should be understood that each of the above-mentioned division devices is essentially the same as the device described above in FIGS. 10 and 12. In FIG. 14B the top division device 1000b includes a top first flexible accumulator 302b having an input on line 108b to accept the top low resolution ratio. The top first flexible accumulator 302b divides a low resolution top numerator on line 306b, by $D_n$, to create a top first carry bit on line 1014b, and uses the top first carry bit to create a top k-bit quotient on line 426b. Then, the top k-bit quotient on line 426b and $I_n$ (line 1003b) are used to create the final numerator divisor on line 1304.

In FIG. 14C the bottom division device 1000c includes a bottom first flexible accumulator 302c having an input on line 108c to accept the bottom low resolution ratio. The bottom first flexible accumulator 302c divides a low resolution bottom numerator on line 306a by $D_d$ (line 314c), to create a bottom first carry bit on line 1014c, and uses the bottom first carry bit to create a bottom k-bit quotient on line 426c. The bottom division device 1000c uses the bottom k-bit quotient on line 426c and $I_d$ (line 1003c) to create the final denominator divisor on line 314a.

In FIG. 14A the final division device 1000a includes a final first flexible accumulator 302a having an input on line 108a to accept the low resolution final ratio. The final first flexible accumulator 302a divides the low resolution final numerator divisor on line 306a, by the final denominator divisor on line 314a, to create a final first carry bit on line 1014a. The final division device 1000a uses the final first carry bit to create a final k-bit quotient on line 426a, and uses the final k-bit quotient and $I_O$ (line 1003a) to create the final divisor on line 112.

Contrasting FIGS. 13 and 14A-14C, in one aspect the calculator module 102 has an input on line 1008b to accept a resolution signal for establishing a resolution threshold of X bits (Nmax). The calculator module 102 establishes a top low resolution mode and supplies the top complement mode signal on line 1004b in response to the $N_n$ being resolved with greater than X bits. The top first flexible accumulator 302b (FIG. 14B) creates a binary top first sum of $(D_n-N_n)$ on line 310b, and a binary top first count from a previous cycle (line 308b), if $N_n$ is resolved with greater than X bits. Alternatively, the top first flexible accumulator 302b creates the top first sum on line 310b of $N_n$, and the top first count from a previous cycle (line 308b), if $N_n$ is resolved with X, or fewer bits.

The top first flexible accumulator 302b creates a binary to first difference on line 316b between the top first sum (line 310b) and $D_n$ (line 314b), compares the top first sum with $D_n$, and generates the top first carry bit on line 1014b in response to the comparing. The top first flexible accumulator 302b adds the complement of the top first carry bit to a binary top first sequence on line 328b if $N_n$ is resolved with greater than X bits. Alternatively, the top first flexible accumulator 302b adds the top first carry bit to the top first binary sequence if $N_n$ is resolved with X, or fewer bits.

The top division device 1000b further includes a top quotientizer 424b having an input on line 328b to accept the top first binary sequence and an output on line 426b to supply the top k-bit quotient. A top complement summing module 1006b has an input on line 426b to accept the top k-bit quotient, an input on line 1003b to accept the integer $I_n$, and an input on line 1004b to accept the top complement mode signal. The top complement summing module 1006b subtracts the top k-bit quotient from $(I_n+1)$ to supply the final numerator divisor at an output on line 1304, if $N_n$ is resolved with greater than X bits. Alternatively, the top complement summing module 1006b adds the top k-bit quotient to $I_n$ if $N_n$ is resolved with X, or fewer bits.

In another aspect, the calculator module 102 (FIG. 13) has an input on line 1008c to accept a resolution signal for establishing a resolution threshold of Y bits (Dmax). The calculator module 102 establishes a bottom low resolution mode and supplies the bottom complement mode signal on line 1004c in response to the $N_d$ being resolved with greater than Y bits. The bottom first flexible accumulator 302c (FIG. 14C) creates a binary top first sum (line 310c) of $(D_d-N_d)$, and a binary bottom first count from a previous cycle (line 308c), if $N_d$ is resolved with greater than Y bits. Alternatively, the bottom first flexible accumulator 302c creates the bottom first sum (line 310c) of $N_d$, and the bottom first count from a previous cycle (line 308c), if $N_d$ is resolved with Y, or fewer bits.

The bottom first flexible accumulator 302c creates a binary bottom first difference on line 316c between the bottom first sum (line 310c) and $D_d$ (line 314c), compares the bottom first sum with $D_d$, and generates the bottom first carry bit on line 1014c in response to the comparing. The bottom first flexible accumulator 302c adds the complement of the bottom first carry bit to a binary bottom first sequence on line 328c if $N_d$ is resolved with greater than Y bits. Alternatively, the bottom first flexible accumulator 302c adds the bottom first carry bit to the bottom first binary sequence if $N_d$ is resolved with Y, or fewer bits.

The bottom division device 1000c further includes a bottom quotientizer 424c having an input on line 328c to accept the bottom first binary sequence and an output on line 426c to supply the bottom k-bit quotient. A bottom complement summing module 1006c has an input on line 426c to accept the bottom k-bit quotient, an input on line 1003c to accept the integer $I_d$, and an input on line 1004c to accept the bottom complement mode signal. The bottom complement summing module 1006c subtracts the bottom k-bit quotient from ($I_d$+1) to supply the final denominator divisor at an output on line 314a, if $N_d$ is resolved with greater than Y bits. Alternatively, the bottom complement summing module 1006c adds the bottom k-bit quotient to $I_d$ if $N_d$ is resolved with Y, or fewer bits.

In another aspect, the calculator module 102 (FIG. 13) has an input on line 1008a to accept a resolution signal for establishing a resolution threshold of Z bits. The calculator module 102 establishes a final low resolution mode and supplies the final complement mode signal on line 1004a in response to the final numerator divisor being resolved with greater than Z bits. The final first flexible accumulator 302a creates a binary final first sum on line 310a of (the final denominator divisor (line 314a)—the final numerator divisor (line 1304)), and a binary final first count from a previous cycle (line 308a), if the final numerator divisor is resolved with greater than Z bits. Alternatively, the final flexible accumulator 302a creates the final first sum (line 310a) of the final numerator divisor, and the final first count from a previous cycle (line 308a), if the final numerator divisor is resolved with Z, or fewer bits.

The final first flexible accumulator creates a binary final first difference on line 316a between the final first sum on line 310a and the final denominator divisor on line 314a, compares the final first sum with the final denominator divisor, and generates the final first carry bit on line 1014a in response to the comparing. The final flexible accumulator 302a adds the complement of the final first carry bit to a binary final first sequence on line 328a if the final numerator divisor is resolved with greater than Z bits. Alternatively, the final flexible accumulator 302a adds the final first carry bit on line 1014a to the final first binary sequence on line 328a if the final numerator divisor (line 1304) is resolved with Z, or fewer bits.

The final division device 1000a further includes a final quotientizer 424a having an input on line 328a to accept the final first binary sequence and an output on line 426a to supply the final k-bit quotient. A final complement summing module 1006a has an input on line 426a to accept the final k-bit quotient, an input on line 1003a to accept the integer $I_O$, and an input on line 1004a to accept the final complement mode signal. The final complement summing module 1006a subtracts the final k-bit quotient from ($I_O$+1) to supply the final divisor at an output on line 112, if the final numerator divisor is resolved with greater than Z bits. Alternatively, the final complement summing module 1006a adds the final k-bit quotient to $I_O$ if the final numerator divisor (line 1304) is resolved with Z, or fewer bits.

The top division device 1000b (FIG. 14B), bottom division device 1000c (FIG. 14c), and final division device 1000a (FIG. 14A) each typically include a chain of (m−1) flexible accumulators linked to each first flexible accumulator. As shown in FIG. 14A for example, a final second flexible accumulator 400a is linked to final first flexible accumulator 302a. Likewise, the final (m−1)th flexible accumulator 440a is linked to accumulator 400a, and the final mth flexible accumulator 436 is linked to the (m−1)th accumulator 440a.

Each ith flexible accumulator in the chain accepts an (ith−1) count from a previous cycle and an ith count from the previous cycle, creates a binary ith sum of the (ith−1) count and the ith count. Each ith flexible accumulator creates a binary ith difference between ith sum and, respectively in each chain—$D_n$, $D_d$, and the final denominator divisor, and compares the ith sum with, respectively in each chain—$D_n$, $D_d$, and the final denominator divisor. If the ith sum is greater than, respectively in each chain—$D_n$, $D_d$, and the final denominator divisor, then a binary "1" ith carry bit is generated and the ith difference is used as the ith count for a subsequent cycle. If the ith sum is less than or equal to, respectively in each chain—$D_n$, $D_d$, and the final denominator divisor, then a binary "0" ith carry bit is generated and the ith sum is used as the ith count for the subsequent cycle.

The ith carry bit is added to an ith binary sequence if, respectively in each chain—$N_n$, $D_n$, and the final numerator divisor, is resolved with, respectively in each chain—X, Y, and Z, or fewer bits. Alternatively, the complement of the ith carry bit is added to the ith binary sequence if, respectively in each chain—$N_n$, $D_n$, and the final numerator divisor, is resolved with, respectively in each chain, greater than X, Y and Z bits. The top 1000b, bottom 1000c, and final 1000a division devices each use the m iteratively generated binary sequences to generate, respectively, the top 426b, bottom 426c, and final 426a k-bit quotients. It should be understood that the value of m and k need not necessarily be the same in each of the above-mentioned flexible accumulator chains.

Figure 15:
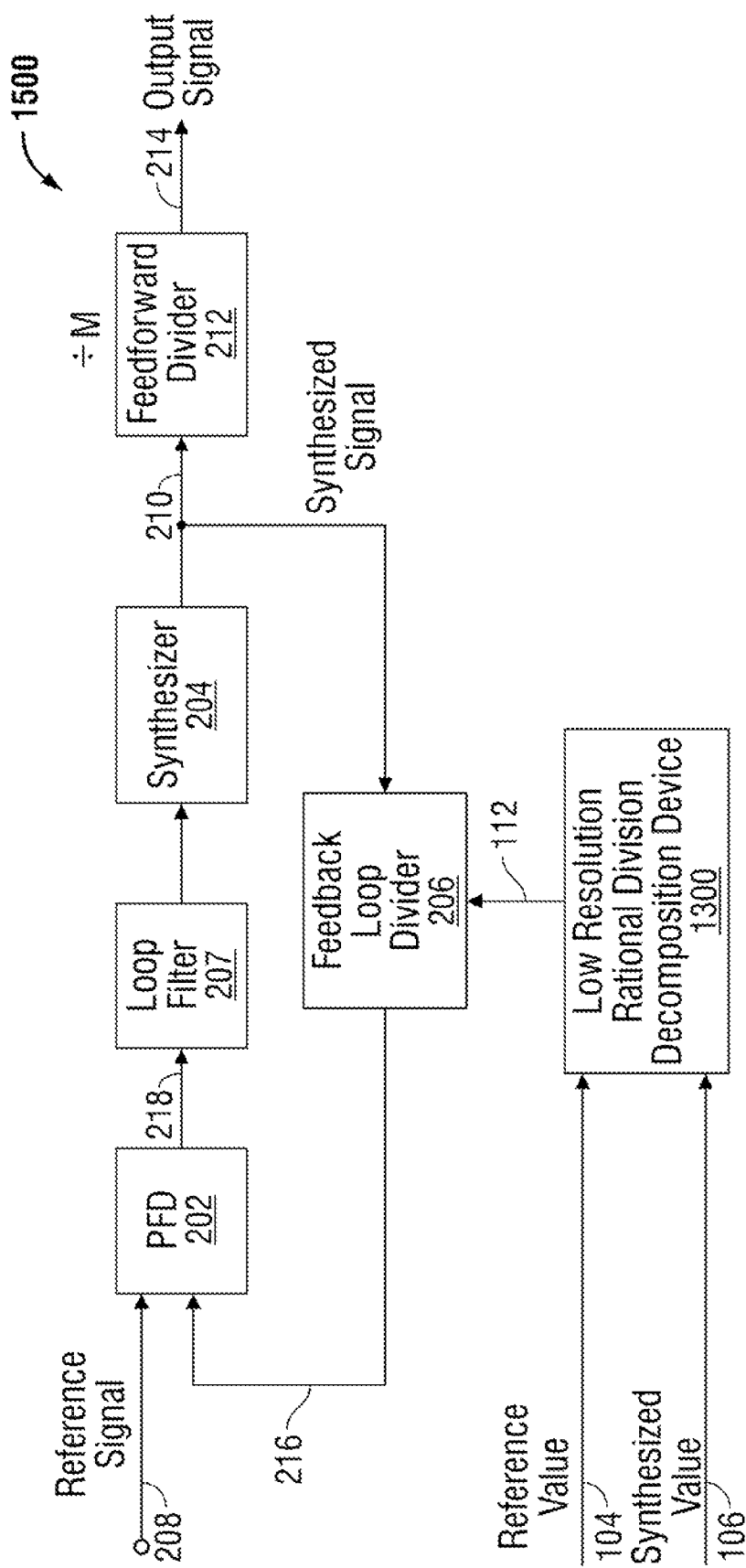
FIG. 15 is a schematic block diagram of a phase-locked loop (PLL) using the low resolution rational division decomposition devices of FIG. 13.

FIG. 15 is a schematic block diagram of a phase-locked loop (PLL) using the low resolution rational division decomposition devices of FIG. 13. The PLL 1500 also includes a phase/frequency detector (PFD) 202, frequency synthesizer 204, and feedback loop divider 206. The PFD 202 accepts a reference signal on line 208 having a frequency equal to the reference frequency value. The frequency synthesizer 204 generates a synthesized signal on line 210 having a frequency nominally equal to the synthesized frequency value. The feedback loop divider 206 has an input on line 210 to accept the synthesized signal and an input on line 112 to accept the final divisor. The feedback loop divider 206 divides the synthesizer signal on line 210 by the final divisor on line 112 to supply a clock signal on line 216. The PFD 202 compares the clock signal frequency to the reference frequency, and in response to the comparison, locks the synthesizer signal on line 210 to the reference signal on line 208.

Although the above-described systems have been depicted as a combination of connected hardware elements, some aspects parts of the system may be enabled using software instructions stored in memory that are called and performed by a processor or logic-coded state machine device (not shown).

FUNCTIONAL DESCRIPTION

The low resolution rational division device described above in FIGS. 10-12 is a type of Sigma-Delta modulator, and can be described as:

$\Sigma\Delta[I,N,D]$, with $N<D$ where I: Integer part, N: Numerator part, and D: Denominator. In combination with reference frequency fr, an output frequency, fo can be generated as follows:

$$f_o = I\frac{N}{D} \times f_r = \left(I + \frac{N}{D}\right) \times f_r = \frac{(I \times D) + N}{D} \times f_r$$

If the operation produces $$\frac{(I \times D) + N}{D},$$

then fo can be denoted as:

$$f_o = \sum \Delta[I, N, D] * fr$$

When the Integer part is (I+1), the Nominator part is (D−N), the Denominator part is D, and when the complement mode signal (C) is asserted, then the Complement Sigma-Delta Modulator can be denoted as:

$$C\Sigma\Delta[I,N,D] = \Sigma\Delta[(1+I),(D-N),D]$$

Since, I+N/D=I+1−1+N/D, then
I+N/D=(I+1)−(D−N)/D.

Therefore, the Complement. Sigma-Delta Modulator, as described above in FIG. 10, can be programmed to perform the same function as the system described in FIG. 6 by deasserting the complement mode signal.

Below is an example calculation.

Assuming that I=62, N=613, D=617, and X ($N_{max}$)=512.
Since N>X, the complement operation is required.

$$62\frac{613}{617} = 62 + 1 - 1 + \frac{613}{617} = 63 - \frac{(617-613)}{617} = 63 - \frac{4}{617}$$

Here, the numerator (D−N) is 4, which is less than 512 (X), and $$\Sigma\Delta[62,613,617] = C\Sigma\Delta[63,4,617].$$

The Sigma-Delta Modulator Decomposition system of FIGS. 13 and 14A through 14C is composed of 3 Complement SDMs. The SDM decomposition can be described as:

$$C\Sigma\Delta[I_O, C\Sigma\Delta_N[I_n,N_n,D_n], C\Sigma\Delta_D[I_d,N_d,D_d]];$$

where DSN is the final numerator divisor;
where DSD is the final denominator divisor; and,
where all DSN and DSD such that DSN<DSD.

If the reference frequency is fr and the output frequency is fo, then:

$$fo = C\Sigma\Delta[I_O, C\Sigma\Delta_N[I_n,N_n,D_n], C\Sigma\Delta_D[I_d,N_d,D_d]]*fr.$$

Figure 16:
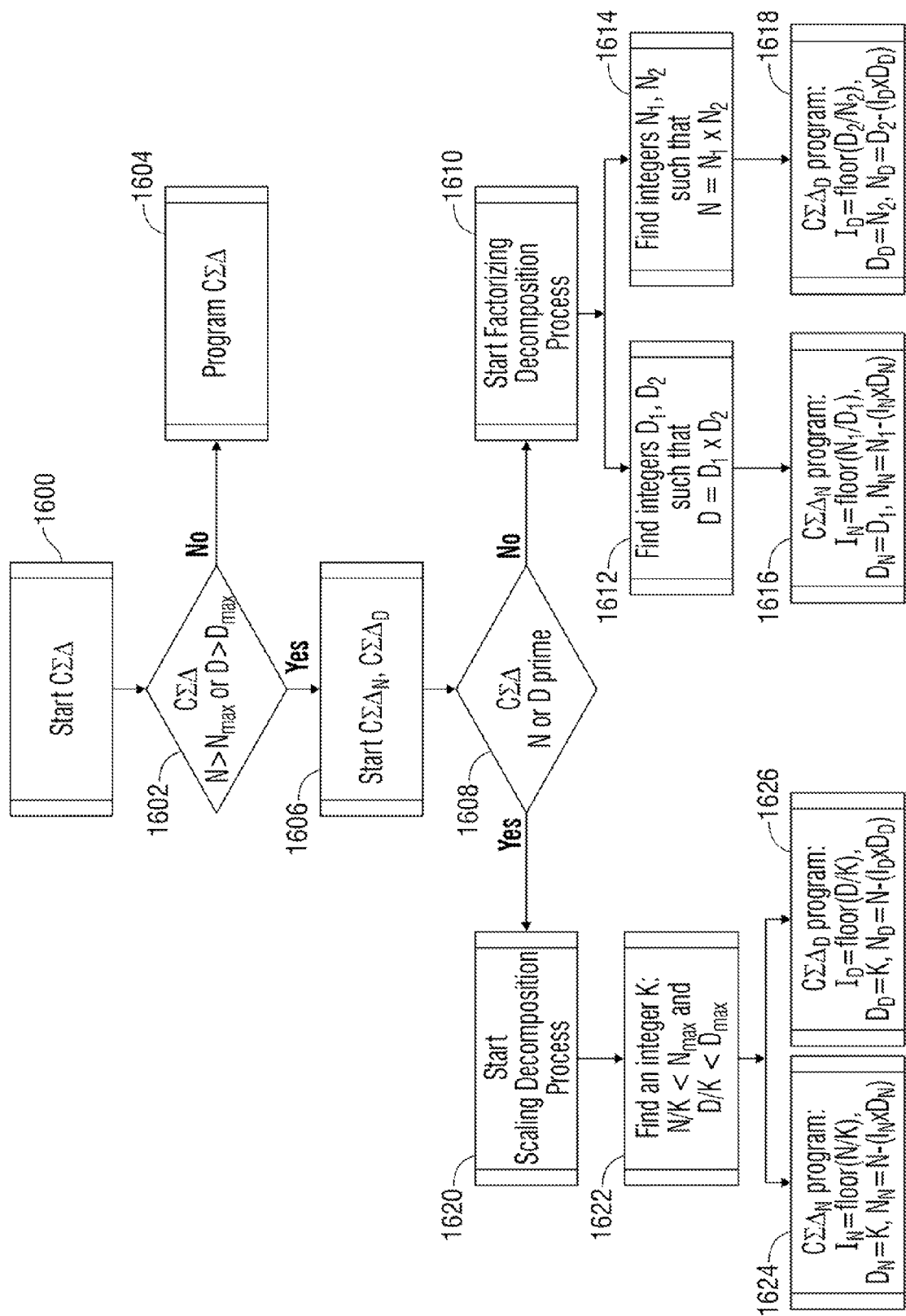
FIG. 16 is a flowchart illustrating the process of rational division using complementary decomposition.

FIG. 16 is a flowchart illustrating the process of rational division using complementary decomposition. Nmax (X) and Dmax (Y) are the maximum resolution thresholds for the numerator and denominator, respectively. The process starts at Step 1600. In Step 1602 a determination is made as to whether $N_n$ and $D_n$ are less than their resolution thresholds. If less, the process goes to Step 1604, where division is performed as in the system of FIG. 6. Otherwise, decomposition is started in Step 1606. In Step 1608 a determination is made as to whether $N_n$ and $D_n$ are prime numbers. If not, the process continues to Step 1610. In Step 1612 the denominator is factored and in Step 1614 the numerator is factored. In Step 1616 a low resolution top ratio is determined and in Step 1618 a low resolution bottom ratio is determined. If $N_n$ and/or $D_n$ are prime numbers, a scaling decomposition process begins at Step 1620. In Step 1622 the numerator and denominator are each divided by an integer K. Using K, Steps 1624 and 1626 find low resolution top and bottom ratios, respectively.

Below is an example of a scaling decomposition process with all complement signals deasserted.

Assume C$\Sigma\Delta$(52, 317, 433) with Nmax=128 and Dmax=256. 317 is greater than 128, and 433>256. 317 and 433 are also both prime numbers, so scaling decomposition is needed.

$$52\frac{31_7}{43_3} = 52\frac{\frac{31_7}{5}}{\frac{43_3}{5}} = 52\frac{63\frac{2}{5}}{86\frac{3}{5}}$$

Therefore, SDM decomposition is:

$$C\Sigma\Delta[I_O, C\Sigma\Delta_N[I_N,N_N,D_N], C\Sigma\Delta_D[I_D,N_D,D_D]] = C\Sigma\Delta[52, C\Sigma\Delta_N[63,2,5], C\Sigma\Delta_D[86,3,5]$$

Note that $N_n$ and $N_d$ are less than Nmax, and $D_n$ and $D_d$ are less than Dmax.

Below is an example of the factorizing decomposition process with all complement signals deasserted.

Assume C$\Sigma\Delta$(52, 316, 432) with Nmax=128 and Dmax=256. 316 is greater than 128, and 432>256. 316 and 432 are not prime numbers, so factoring decomposition is used.

$$52\frac{316}{432} = 52\frac{79 \times 4}{27 \times 16} = 52\frac{\frac{79}{16}}{\frac{27}{4}} = 52\frac{4\frac{15}{16}}{6\frac{3}{4}}$$

$$C\Sigma\Delta[I_O, C\Sigma\Delta_N[I_n,N_n,D_d], C\Sigma\Delta_D[I_d,N_d,D_d]] = C\Sigma\Delta[52, C\Sigma\Delta_N[4,15,16], C\Sigma\Delta_D[6,3,4]$$

Note that $N_n$ and $N_d$ are less than Nmax, and $D_n$ and $D_d$ are less than Dmax.

The above examples utilize deasserted complement mode signals. However, each C$\Sigma\Delta$ can also be configured in the complement mode, or configured in the complement mode with factoring/scaling.

Figure 17A:
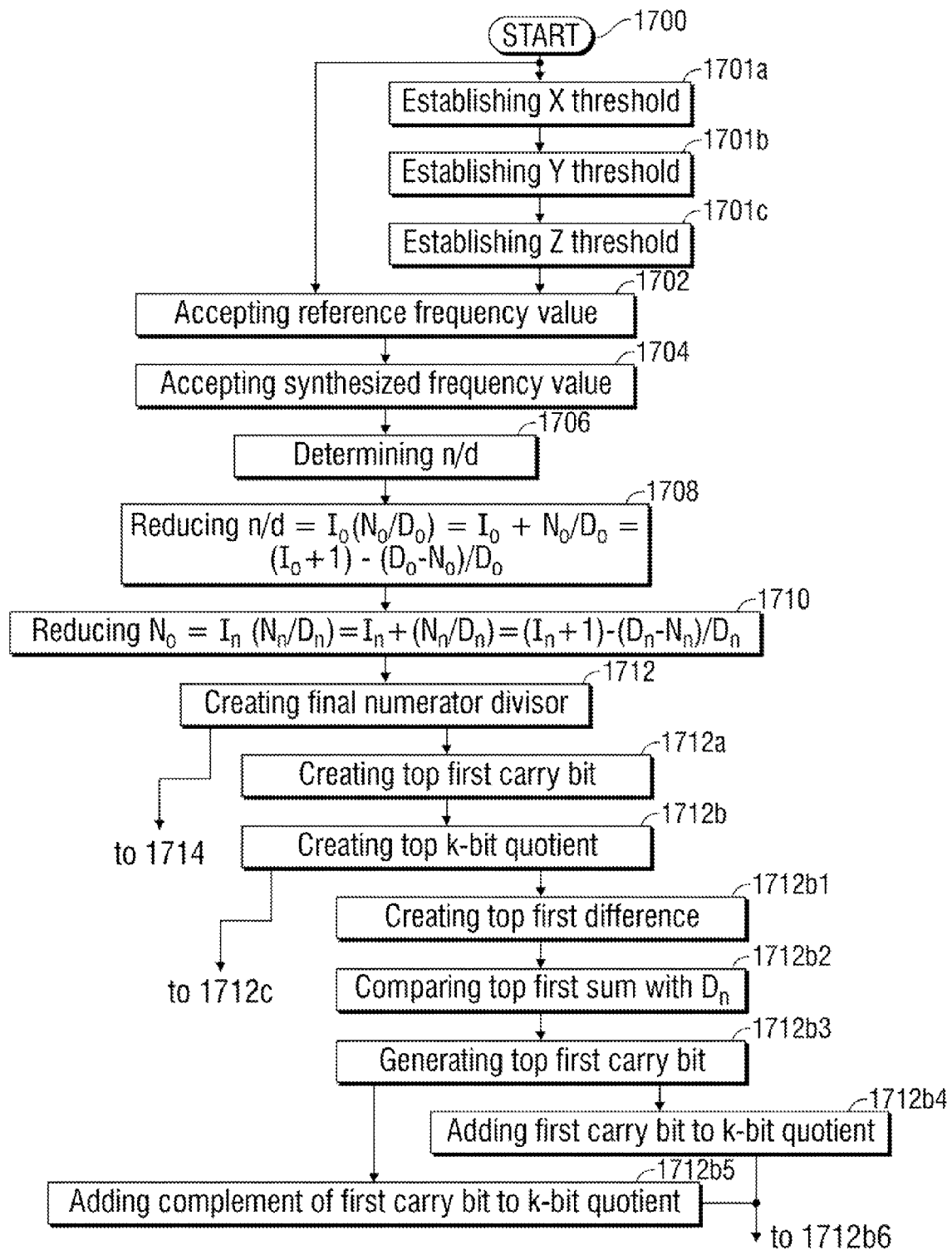
FIGS. 17A, 17B, and 17C are flowcharts illustrating a method for synthesizing signal frequencies using low resolution rational division decomposition in a frequency synthesis device.
Figure 17B:
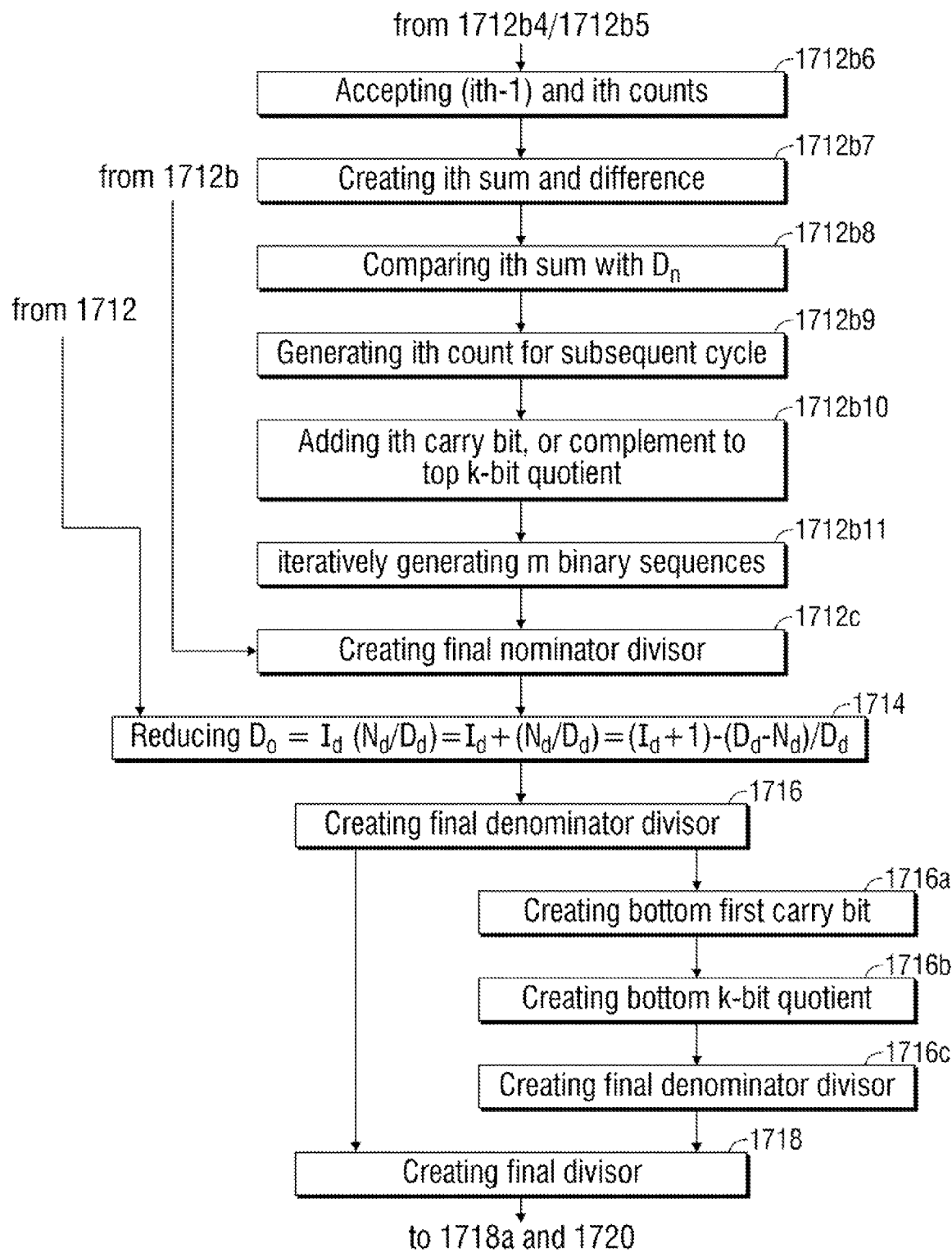
Figure 17C:
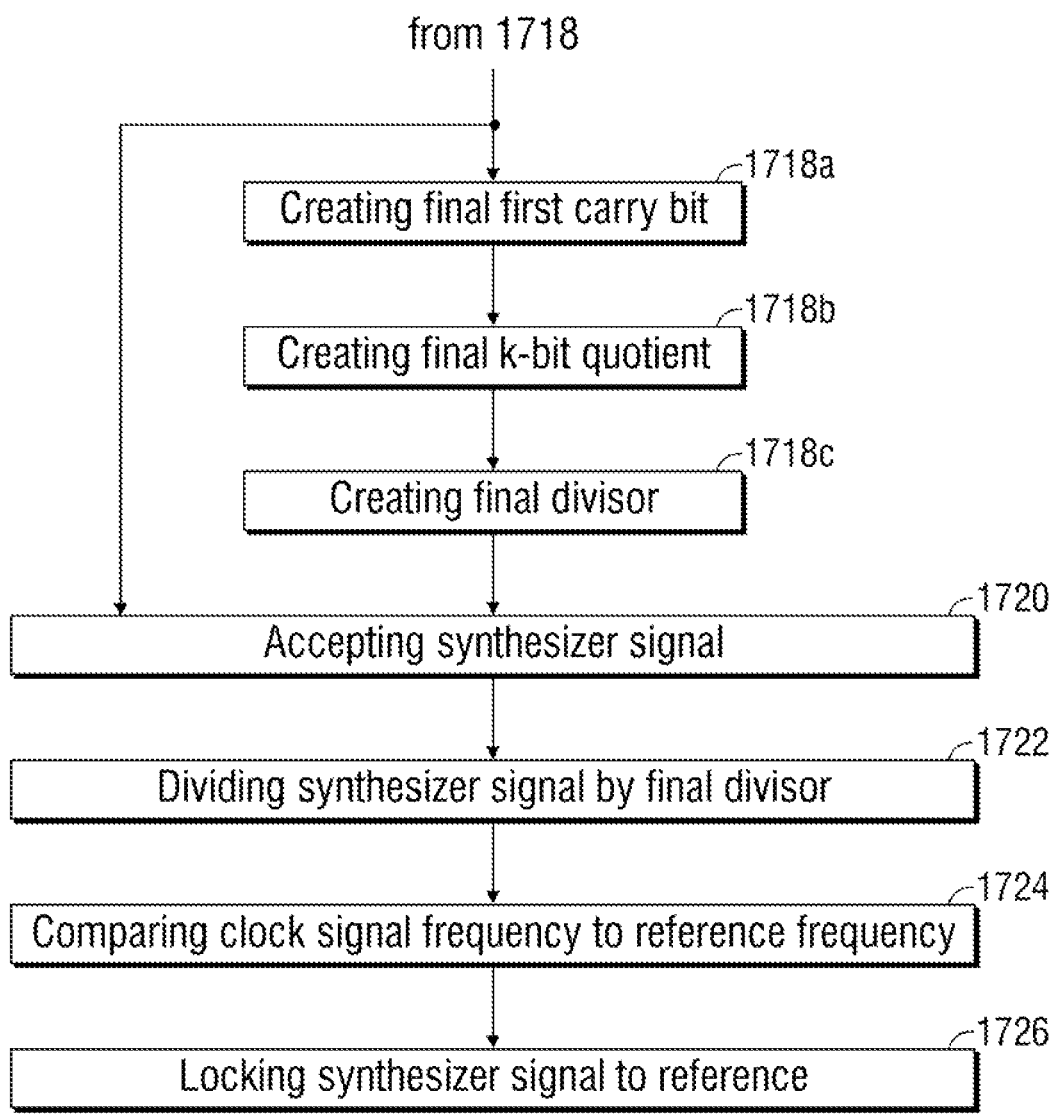

FIGS. 17A and 17B are flowcharts illustrating a method for synthesizing signal frequencies using low resolution rational division decomposition in a frequency synthesis device. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally, however, the steps are performed in numerical order. The method starts at Step 1700.

Step 1702 accepts a reference frequency value and Step 1704 accepts a synthesized frequency value. In response to dividing the synthesized frequency value by the reference frequency value, Step 1706 determines an integer value numerator (n) and an integer value denominator (d). Step 1708 reduces the ratio of n/d=$I_O$($N_O/D_O$)=$I_O$+$N_O/D_O$=($I_O$+1)−($D_O$−$N_O$)/$D_O$, and where $N_O/D_O$<1 and $N_O$ and $D_O$ are integers. Step 1710 reduces $N_O$=$I_n$($N_n/D_n$)=$I_n$+$N_n/D_n$=($I_n$+

1)−$(D_n−N_n)/D_n$, where $I_n$, $N_n$, and $D_n$ are integers, and $N_n/D_n<1$. Using $I_n$, $N_n$, and $D_n$, Step 1712 creates a final numerator divisor. Step 1714 reduces $D_O=I_d(N_d/D_d)=I_d+N_d/D_d=(I_d+1)−(D_d−N_d)/D_d$, where $I_d$, $N_d$, and $D_d$ are integers, and $N_d/D_d<1$. Using $I_d$, $N_d$, and $D_d$, Step 1716 creates a final denominator divisor. Using $I_O$, the final numerator divisor, and the final denominator divisor, Step 1718 creates a final divisor.

In one aspect, creating the final numerator divisor in Step 1712 includes substeps. In Step 1712a a top first flexible accumulator divides a low resolution top numerator by the $D_n$ to create a top first carry bit. Step 1712b uses the top first carry bit to create a top k-bit quotient. Step 1712c uses the top k-bit quotient and $I_n$ to create the final numerator divisor. Creating the final denominator divisor in Step 1716 includes the following substeps. In Step 1716a a bottom first flexible accumulator divides a low resolution bottom numerator by $D_d$ to create a bottom first carry bit. Step 1716b uses the bottom first carry bit to create a bottom k-bit quotient. Step 1716c uses the bottom k-bit quotient and $I_d$ to create the final denominator divisor.

Likewise, creating the final divisor in Step 1718 may include the following substeps. In Step 1718a a final first flexible accumulator divides a low resolution final numerator divisor by the final denominator divisor, to create a final first carry bit. Step 1718b uses the final first carry bit to create a final k-bit quotient. Step 1718c uses the final k-bit quotient and $I_O$ to create the final divisor.

In another aspect, Step 1701a establishes a resolution threshold of X bits. Then, dividing the low resolution top numerator by the $D_n$ to create the top first carry bit in Step 1712a includes creating a binary top first sum of $(D_n−N_n)$, and a binary top first count from a previous cycle, if $N_n$ is resolved with greater than X bits. Alternatively, Step 1712a creates the top first sum of $N_n$, and the top first count from a previous cycle, if $N_n$ is resolved with X, or fewer bits.

Using the top first carry bit to create the top k-bit quotient (Step 1712b) may include substeps. Step 1712b1 creates a binary top first difference between the top first sum and $D_n$. Step 1712b2 compares the top first sum with $D_n$. In response to the comparing, Step 1712b3 generates the top first carry bit. Step 1712b4 adds the complement of the top first carry bit to a binary top first sequence if $N_n$ is resolved with greater than X bits. Alternatively, Step 1712b5 adds the top first carry bit to the top first binary sequence if $N_n$ is resolved with X, or fewer bits.

Creating the final numerator divisor (Step 1712c) may include subtracting the top k-bit quotient from $(I_n+1)$ if $N_n$ is resolved with greater than X bits. Alternatively, the top k-bit quotient is added to $I_n$ if $N_n$ is resolved with X, or fewer bits.

In another aspect, Step 1701b establishes a resolution threshold of Y bits. Then, dividing the low resolution bottom numerator by the $D_d$ to create the bottom first carry bit in Step 1716a may include creating a binary bottom first sum of $(D_d−N_d)$, and a binary bottom first count from a previous cycle, if $N_d$ is resolved with greater than Y bits. Alternatively, Step 1716a creates the bottom first sum of $N_d$, and the bottom first count from a previous cycle, if $N_d$ is resolved with Y, or fewer bits.

In one aspect, using the bottom first carry bit to create the bottom k-bit quotient in Step 1716b may include the following substeps. Step 1716b1 creates a binary bottom first difference between the bottom first sum and the $D_d$. Step 1716b2 compares the bottom first sum with $D_d$. In response to the comparing, Step 1716b3 generates the bottom first carry bit. Step 1716b4 adds the complement of the bottom first carry bit to a binary bottom first sequence if $N_d$ is resolved with greater than Y bits. Alternatively, Step 1716b5 adds the bottom first carry bit to the bottom first binary sequence if $N_d$ is resolved with Y, or fewer bits.

In one aspect, creating the final denominator divisor in Step 1716c includes subtracting the bottom k-bit quotient from $(I_d+1)$ if $N_d$ is resolved with greater than Y bits. Alternatively, Step 1716c adds the bottom k-bit quotient to $I_d$ if $N_d$ is resolved with Y, or fewer bits.

In another aspect, Step 1701c establishes a resolution threshold of Z bits. Then, dividing the low resolution final numerator divisor by the final denominator divisor, to create a final first carry bit in Step 1718a includes creating a binary final first sum of $(D_O−N_O)$, and a binary final first count from a previous cycle, if $N_O$ is resolved with greater than Z bits. Alternatively, Step 1718a creates the final first sum of $N_O$, and the final first count from a previous cycle, if $N_O$ is resolved with Z, or fewer bits.

In one aspect, using the final first carry bit to create the final k-bit quotient in Step 1718b includes substeps. Step 1718b1 creates a binary final first difference between the final first sum and the final denominator divisor. Step 1718b2 compares the final first sum with the final denominator divisor. In response to the comparing, Step 1718b3 generates the final first carry bit. Step 1718b4 adds the complement of the final first carry bit to a binary final first sequence if $N_O$ is resolved with greater than Z bits. Alternatively, Step 1718b5 adds the final first carry bit to the final first binary sequence if $N_O$ is resolved with Z, or fewer bits.

In one aspect, creating the final divisor in Step 1718c includes subtracting the final k-bit quotient from $(I_O+1)$ if $N_O$ is resolved with greater than Z bits. Alternatively, Step 1718c adds the final k-bit quotient to $I_O$ if $N_O$ is resolved with Z, or fewer bits.

In one aspect, using the first carry bit to create the final k-bit quotient in the Step 1712b, Step 1716b, and Step 1718b further includes the following substeps. In the interest of brevity, only Steps 1712b6 through 1712b11 are explicitly shown. However, it should be understood that the method is intended to describe equivalent steps associated with Step 1716b and Step 1718b. In Step 1712b6, a chain of (m−1) flexible accumulators is linked to each first flexible accumulator, where each ith flexible accumulator in the chain accepts an (ith−1) count from a previous cycle and an ith count from the previous cycle.

Step 1712b7 creates a binary ith sum of the (ith−1) count and the ith count, and creates a binary ith difference between ith sum and, respectively in each chain—$D_n$, $D_d$, and the final denominator divisor. Step 1712b8 compares the ith sum with, respectively in each chain—$D_n$, $D_d$, and the final denominator divisor. In Step 1712b9, if the ith sum is greater than, respectively in each chain—$D_n$, $D_d$, and the final denominator divisor, then a binary "1" ith carry bit is generated and the ith difference is used as the ith count for a subsequent cycle. Alternatively, if the ith sum is less than or equal to, respectively in each chain—$D_n$, $D_d$, and the final denominator divisor, then a binary "0" ith carry bit is generated and the ith sum is used as the ith count for the subsequent cycle. In Step 1712b10 the ith carry bit is added to the ith binary sequence if, respectively in each chain—$N_n$, $D_n$, and the final numerator divisor, is resolved with, respectively in each chain, X, Y, and Z, or fewer bits. Alternatively, a complement of the ith carry bit is added to the ith binary sequence if, respectively in each chain—$N_n$, $D_n$, and the final numerator divisor, is resolved with, respectively in each chain, greater than X, Y and Z bits. Step 1712b11 iteratively generates m binary sequences. Then, generating, respectively in each chain, the top, bottom, and final k-bit quotients (Steps 1712c, 1716c, and 1718c)

includes using the m binary sequences to generate, respectively in each chain, the top, bottom, and final k-bit quotients.

Step 1720 accepts a synthesizer signal having the nominal synthesized frequency. Step 1722 divides the synthesizer signal by the final divisor to generate a clock signal. Step 1724 compares the clock signal frequency to a reference signal having the reference frequency. In response to the comparison, Step 1726 frequency locks the synthesizer signal to the reference signal.

A system and method have been provided that permit frequency synthesis based upon rational division using a low resolution nominator and decomposition. Some examples of circuitry and methodology steps have been given as examples to illustrate the invention. However, the invention is not limited to merely these examples. Likewise, the invention has been described in the context of binary numbers. However, the invention is not limited to any particular number base. Other variations and embodiments of the invention will occur to those skilled in the art.

We claim:

1. A method for synthesizing signal frequencies using low resolution rational division decomposition, the method comprising:
   accepting, by a calculator module including a processor, a reference frequency value;
   accepting, by the calculator module, a synthesized frequency value;
   in response to dividing the synthesized frequency value by the reference frequency value, determining an integer value numerator (n) and an integer value denominator (d);
   reducing a ratio of $n/d = I_O(N_O/D_O) = I_O + N_O/D_O = (I_O+1) - (D_O - N_O)/D_O$, where $N_O/D_O < 1$ and $N_O$ and $D_O$ are integers;
   reducing $N_O = I_n(N_n/D_n) = I_n + N_n/D_n = (I_n+1) - (D_n - N_n)/D_n$, where $I_n$, $N_n$, and $D_n$ are integers, and $N_n/D_n < 1$;
   using $I_n$, $N_n$, and $D_n$ to create a final numerator divisor;
   reducing $D_O = I_d(N_d/D_d) = I_d + N_d/D_d = (I_d+1) - (D_d - N_d)/D_d$, where $I_d$, $N_d$, and $D_d$ are integers, and $N_d/D_d < 1$;
   using $I_d$, $N_d$, and $D_d$ to create a final denominator divisor; and
   using $I_O$, the final numerator divisor, and the final denominator divisor to create a final divisor.

2. The method of claim 1, wherein creating the final numerator divisor comprises:
   in a top first flexible accumulator, dividing a low resolution top numerator by $D_n$ to create a top first carry bit;
   using the top first carry bit to create a top k-bit quotient;
   using the top k-bit quotient and $I_n$ to create the final numerator divisor;
   wherein creating the final denominator divisor comprises:
      in a bottom first flexible accumulator, dividing a low resolution bottom numerator by $D_d$ to create a bottom first carry bit;
      using the bottom first carry bit to create a bottom k-bit quotient; and
      using the bottom k-bit quotient and $I_d$ to create the final denominator divisor;
   wherein creating the final divisor comprises:
      in a final first flexible accumulator, dividing a low resolution final numerator divisor by the final denominator divisor to create a final first carry bit;
      using the final first carry bit to create a final k-bit quotient; and
      using the final k-bit quotient and $I_O$ to create the final divisor.

3. The method of claim 2, the acts further comprising:
   establishing a resolution threshold of X bits, where X is an integer; and
   wherein dividing the low resolution top numerator by $D_n$ to create the top first carry bit includes:
      creating a binary top first sum of $(D_n - N_n)$, and a binary top first count from a previous cycle, if $N_n$ is resolved with greater than X bits; and
      creating the binary top first sum of $N_n$, and the binary top first count from the previous cycle, if $N_n$ is resolved with X bits or fewer than X bits.

4. The method of claim 3, wherein using the top first carry bit to create the top k-bit quotient comprises:
   creating a binary top first difference between the binary top first sum and $D_n$;
   comparing the binary top first sum with $D_n$;
   in response to the comparing, generating the top first carry bit;
   adding a complement of the top first carry bit to a binary top first sequence if $N_n$ is resolved with greater than X bits; and
   adding the top first carry bit to the binary top first sequence if $N_n$ is resolved with X bits or fewer than X bits.

5. The method of claim 4, wherein creating the final numerator divisor comprises:
   subtracting the top k-bit quotient from $(I_n+1)$ if $N_n$ is resolved with greater than X bits; and,
   adding the top k-bit quotient to $I_n$ if $N_n$ is resolved with X bits or fewer than X bits.

6. The method of claim 2, the acts further comprising:
   establishing a resolution threshold of Y bits, where Y is an integer; and
   wherein dividing the low resolution bottom numerator by $D_d$ to create the bottom first carry bit comprises:
      creating a binary bottom first sum of $(D_d - N_d)$, and a binary bottom first count from a previous cycle, if $N_d$ is resolved with greater than Y bits; and
      creating the binary bottom first sum of $N_d$, and the binary bottom first count from the previous cycle, if $N_d$ is resolved with Y bits or fewer than Y bits.

7. The method of claim 6, wherein using the bottom first carry bit to create the bottom k-bit quotient comprises:
   creating a binary bottom first difference between the binary bottom first sum and $D_d$;
   comparing the binary bottom first sum with $D_d$;
   in response to the comparing, generating the bottom first carry bit;
   adding a complement of the bottom first carry bit to a binary bottom first sequence if $N_d$ is resolved with greater than Y bits; and
   adding the bottom first carry bit to the binary bottom first sequence if $N_d$ is resolved with Y bits or fewer than Y bits.

8. The method of claim 7, wherein creating the final denominator divisor comprises:
   subtracting the bottom k-bit quotient from $(I_d+1)$ if $N_d$ is resolved with greater than Y bits; and,
   adding the bottom k-bit quotient to $I_d$ if $N_d$ is resolved with Y bits or fewer than Y bits.

9. The method of claim 2 further comprising:
   establishing a resolution threshold of Z bits, where Z is an integer; and
   wherein dividing the low resolution final numerator divisor by the final denominator divisor to create the final first carry bit comprises:
      creating a binary final first sum of $(D_O - N_O)$, and a binary final first count from a previous cycle, if $N_O$ is resolved with greater than Z bits; and creating the binary final first sum of $N_O$, and the binary final first count from the previous cycle, if $N_O$ is resolved with Z bits or fewer than Z bits.

10. The method of claim 9, wherein using the final first carry bit to create the final k-bit quotient comprises:
   creating a binary final first difference between the binary final first sum and the final denominator divisor;
   comparing the binary final first sum with the final denominator divisor;
   in response to the comparing, generating the final first carry bit;
   adding a complement of the final first carry bit to a binary final first sequence if $N_O$ is resolved with greater than Z bits; and
   adding the final first carry bit to the binary final first sequence if $N_O$ is resolved with Z bits or fewer than Z bits.

11. The method of claim 10, wherein creating the final divisor comprises:
   subtracting the final k-bit quotient from $(I_O+1)$ if $N_O$ is resolved with greater than Z bits; and
   adding the final k-bit quotient to $I_O$ if $N_O$ is resolved with Z bits or fewer than Z bits.

12. The method of claim 2, wherein creating the final numerator divisor, the final denominator divisor, and the final divisor further comprises:
   in a chain of (m−1) flexible accumulators linked to each of the top first flexible accumulator, the bottom first flexible accumulator, and the final first flexible accumulator, each ith flexible accumulator in the chain accepting an (ith−1) count from a previous cycle and an ith count from the previous cycle;
   creating a binary ith sum of the (ith−1) count and the ith count;
   creating a binary ith difference between ith sum and, respectively in each chain, $D_n$, $D_d$, and the final denominator divisor;
   comparing the ith sum with, respectively in each chain, $D_n$, $D_d$, and the final denominator divisor;
   if the ith sum is greater than, respectively in each chain, $D_n$, $D_d$, and the final denominator divisor:
     generating a binary "1" ith carry bit; and
     using the ith difference as the ith count for a subsequent cycle; and
   if the ith sum is less than or equal to, respectively in each chain, $D_n$, $D_d$, and the final denominator divisor:
     generating a binary "0" ith carry bit; and
     using the ith sum as the ith count for the subsequent cycle;
   adding the ith carry bit to an ith binary sequence if, respectively in each chain, $N_n$, $D_n$, and the final numerator divisor, is resolved with, respectively in each chain, X bits or fewer than X bits, Y bits or fewer than Y bits, and Z bits or fewer than Z bits, and adding a complement of the ith carry bit to the ith binary sequence if, respectively in each chain, $N_n$, $D_n$, and the final numerator divisor, is resolved with, respectively in each chain, greater than X bits, greater than Y bits, and greater than Z bits;
   iteratively generating m binary sequences; and
   wherein generating, respectively in each chain, the top k-bit quotient, the bottom k-bit quotient, and the final k-bit quotient includes using the m binary sequences to generate, respectively in each chain, the top k-bit quotient, the bottom k-bit quotient, and the final k-bit quotient.

13. The method of claim 1 further comprising:
   accepting a synthesizer signal having a nominal synthesized frequency;
   dividing the synthesizer signal by the final divisor to generate a clock signal;
   comparing a frequency of the clock signal to a reference signal having a reference frequency; and
   in response to the comparing, frequency locking the synthesizer signal to the reference signal.

14. A system for synthesizing signal frequencies using low resolution rational division decomposition, the system comprising:
   a calculator module having inputs to accept a reference frequency value and a synthesized frequency value, the calculator module configured to determine an integer value numerator (n) and an integer value denominator (d) in response to dividing the synthesized frequency value by the reference frequency value, and reduce a ratio of $n/d=I_O(N_O/D_O)=I_O+N_O/D_O=(I_O+1)-(D_O-N_O)/D_O$, where $N_O/D_O<1$ and $N_O$ and $D_O$ are integers, the calculator module further configured to reduce $N_O=I_n(N_n/D_n)=I_n+N_n/D_n=(I_n+1)-(D_n-N_n)/D_n$, where $I_n$, $N_n$, and $D_n$ are integers, and $N_n/D_n<1$, and reduce $D_O=I_d(N_d/D_d)=I_d+N_d/D_d=(I_d+1)-(D_d-N_d)/D_d$, where $I_d$, $N_d$, and $D_d$ are integers, and $N_d/D_d<1$, the calculator module having outputs to supply $I_O$, $I_n$, and $I_d$, a top low resolution ratio, a bottom low resolution ratio, a top complement mode signal, a bottom complement mode signal, and a final complement mode signal;
   a top division hardware device having inputs to accept $I_n$, the top low resolution ratio, and the top complement mode signal, and an output to supply a final numerator divisor;
   a bottom division hardware device having inputs to accept $I_d$, the bottom low resolution ratio, and the bottom complement mode signal, and an output to supply a final denominator divisor; and
   a final division hardware device having inputs to accept $I_O$, a low resolution final ratio, and the final complement mode signal, and an output to supply a final divisor.

15. The system of claim 14, wherein the top division device comprises a top first flexible accumulator having an input to accept the top low resolution ratio, the top first flexible accumulator dividing a low resolution top numerator by $D_n$ to create a top first carry bit, the top division device using the top first carry bit to create a top k-bit quotient, and using the top k-bit quotient and $I_n$ to create the final numerator divisor;
   wherein the bottom division device comprises a bottom first flexible accumulator having an input to accept the bottom low resolution ratio, the bottom first flexible accumulator is configured to divide a low resolution bottom numerator by $D_d$ to create a bottom first carry bit, and the bottom division device is configured to use the bottom first carry bit to create a bottom k-bit quotient, and to use the bottom k-bit quotient and $I_d$ to create the final denominator divisor; and
   wherein the final division device comprises a final first flexible accumulator having an input to accept a low resolution final numerator divisor and the final denominator divisor, the final first flexible accumulator is configured to divide the low resolution final numerator divisor by the final denominator divisor to create a final first carry bit, and the final division device is configured to use the final first carry bit to create a final k-bit quotient, and to use the final k-bit quotient and $I_O$ to create the final divisor.

16. The system of claim 15, wherein the calculator module has an input to accept a resolution signal for establishing a resolution threshold of X bits, where X is an integer, the calculator module is configured to establish a top low resolution mode and supply the top complement mode signal in response to $N_n$ being resolved with greater than X bits; and wherein the top first flexible accumulator creates a binary top first sum of $(D_n-N_n)$, and a binary top first count from a previous cycle, if $N_n$ is resolved with greater than X bits, and creates the binary top first sum of $N_n$, and the binary top first count from the previous cycle, if $N_n$ is resolved with X bits or fewer than X bits.

17. The system of claim 16, wherein the top first flexible accumulator creates a binary top first difference between the binary top first sum and $D_n$, compares the binary top first sum with $D_n$ to yield a comparison result, generates the top first carry bit in response to the comparison result, adds a complement of the top first carry bit to a binary top first sequence if $N_n$ is resolved with greater than X bits, and adds the top first carry bit to the binary top first sequence if $N_n$ is resolved with X bits or fewer than X bits.

18. The system of claim 17, wherein the top division device comprises:
   a top quotientizer having an input to accept the binary top first sequence and an output to supply the top k-bit quotient; and
   a top complement summing module having a first input to accept the top k-bit quotient, a second input to accept a value of $I_n$, and a third input to accept the top complement mode signal, wherein the top complement summing module is configured to subtract the top k-bit quotient from $(I_n+1)$ to supply the final numerator divisor at an output if $N_n$ is resolved with greater than X bits, and to add the top k-bit quotient to $I_n$ if $N_n$ is resolved with X bits or fewer than X bits.

19. The system of claim 15, wherein the calculator module has an input to accept a resolution signal for establishing a resolution threshold of Y bits, where Y is an integer, and the calculator module is configured to establish a bottom low resolution mode and to supply the bottom complement mode signal in response to $N_d$ being resolved with greater than Y bits; and wherein the bottom first flexible accumulator creates a binary top first sum of $(D_d-N_d)$, and a binary bottom first count from a previous cycle, if $N_d$ is resolved with greater than Y bits, and creates a bottom first sum of $N_d$, and the binary bottom first count from the previous cycle, if $N_d$ is resolved with Y bits, or fewer than Y bits.

20. The system of claim 19, wherein the bottom first flexible accumulator creates a binary bottom first difference between the bottom first sum and $D_d$, compares the bottom first sum with $D_d$ to yield a comparison result, generates the bottom first carry bit in response to the comparison result, adds a complement of the bottom first carry bit to a binary bottom first sequence if $N_d$ is resolved with greater than Y bits, and adds the bottom first carry bit to the binary bottom first binary if $N_d$ is resolved with Y bits or fewer than Y bits.

21. The system of claim 20, wherein the bottom division device comprises:
   a bottom quotientizer having an input to accept the binary bottom first sequence and an output to supply the bottom k-bit quotient; and
   a bottom complement summing module having a first input to accept the bottom k-bit quotient, a second input to accept a valve of $I_d$, and a third input to accept the bottom complement mode signal, wherein the bottom complement summing module is configured to subtract the bottom k-bit quotient from $(I_d+1)$ to supply the final denominator divisor at an output if $N_d$ is resolved with greater than Y bits, and to add the bottom k-bit quotient to $I_d$ if $N_d$ is resolved with Y bits or fewer than Y bits.

22. The system of claim 15, wherein the calculator module has an input to accept a resolution signal for establishing a resolution threshold of Z bits, and the calculator module is configured to establish a final low resolution mode and supply the final complement mode signal in response to the final numerator divisor being resolved with greater than Z bits; and wherein the final first flexible accumulator creates a binary final first sum of (the final denominator divisor—the final numerator divisor), and a binary final first count from a previous cycle, if the final numerator divisor is resolved with greater than Z bits, and creates the binary final first sum of the final numerator divisor, and the binary final first count from the previous cycle, if the final numerator divisor is resolved with Z bits or fewer than Z bits.

23. The system of claim 22, wherein the final first flexible accumulator creates a binary final first difference between the binary final first sum and the final denominator divisor, compares the binary final first sum with the final denominator divisor to yield a comparison result, generates the final first carry bit in response to the comparison result, adds a complement of the final first carry bit to a binary final first sequence if the final numerator divisor is resolved with greater than Z bits, and adds the final first carry bit to the binary final first sequence if the final numerator divisor is resolved with Z bits or fewer than Z bits.

24. The system of claim 23, wherein the final division device comprises:
   a final quotientizer having an input to accept the binary final first sequence and an output to supply the final k-bit quotient; and
   a final complement summing module having a first input to accept the final k-bit quotient, a second input to accept a value of $I_O$, and a third input to accept the final complement mode signal, wherein the final complement summing module is configured to subtract the final k-bit quotient from $(I_O+1)$ to supply the final divisor at an output if the final numerator divisor is resolved with greater than Z bits, and to add the final k-bit quotient to $I_O$ if the final numerator divisor is resolved with Z bits or fewer than Z bits.

25. The system of claim 15 wherein the top division device, the bottom division device, and the final division device respectively further comprise:
   a chain of (m−1) flexible accumulators linked to each first flexible accumulator, each ith flexible accumulator in the chain is configured to:
      accept an (ith−1) count from a previous cycle and an ith count from the previous cycle;
      create a binary ith sum of the (ith−1) count and the ith count;
      create a binary ith difference between the binary ith sum and, respectively in each chain, $D_n$, $D_d$, and the final denominator divisor;
      compare the ith sum with, respectively in each chain, $D_n$, $D_d$, and the final denominator divisor;
      if the binary ith sum is greater than, respectively in each chain, $D_n$, $D_d$, and the final denominator divisor:
         generate a binary "1" ith carry bit; and
         use the binary ith difference as the ith count for a subsequent cycle; and
      if the binary ith sum is less than or equal to, respectively in each chain, $D_n$, $D_d$, and the final denominator divisor:

generate a binary "0" ith carry bit; and
use the binary ith sum as the ith count for the subsequent cycle;
add the ith carry bit to an ith binary sequence if, respectively in each chain, $N_n$, $D_n$, and the final numerator divisor, is resolved with, respectively in each chain, X bits or fewer than X bits, Y bits or fewer than Y bits, and Z bits or fewer than Z bits, and add a complement of the ith carry bit to the ith binary sequence if, respectively in each chain, $N_n$, $D_n$, and the final numerator divisor, is resolved with, respectively in each chain, greater than X bits, greater than Y bits, and greater than Z bits;
wherein the top division device, the bottom decision device, and the final division device respectively use the m iteratively generated binary sequences to generate, respectively, the top k-bit quotient, the bottom k-bit quotient, and the final k-bit quotient.

26. The system of claim 15, further comprising:
a phase-locked loop (PLL) including a phase/frequency detector (PFD), a frequency synthesizer, and a feedback loop divider, the PFD configured to accept reference signal having a frequency equal to the reference frequency value and the frequency synthesizer is configured to generate a synthesized signal having a frequency nominally equal to the synthesized frequency value; and
wherein the feedback loop divider has a first input to accept the synthesized signal and a second input to accept the final divisor, and the feedback loop divider is configured to divide the synthesized signal by the final divisor to supply a clock signal; and
wherein the PFD is configured to compare a frequency of the clock signal to the reference frequency to yield a comparison result, and lock the synthesized signal to the reference signal based on the comparison result.

27. A non-transitory computer-readable storage medium having stored thereon computer-executable instructions that, in response to execution, cause a computer system to perform operations, the operations comprising:
dividing a synthesized frequency value by a reference frequency value, determining an integer value numerator (n), and determining an integer value denominator (d);
reducing a ratio of $n/d = I_O(N_O/D_O) = I_O + N_O/D_O = (I_O+1) - (D_O - N_O)/D_O$, where $N_O/D_O < 1$, and $N_O$ and $D_O$ are integers;
reducing $N_O = I_n(N_n/D_n) = I_n + N_n/D_n = (I_n+1) - (D_n - N_n)/D_n$, where $I_n$, $N_n$, and $D_n$ are integers, and $N_n/D_n < 1$;
using $I_n$, $N_n$, and $D_n$ to create a final numerator divisor;
reducing $D_O = I_d(N_d/D_d) = I_d + N_d/D_d = (I_d+1) - (D_d - N_d)/D_d$, where $I_d$, $N_d$, and $D_d$ are integers, and $N_d/D_d < 1$;
using $I_d$, $N_d$, and $D_d$ to create a final denominator divisor; and
using $I_O$, the final numerator divisor, and the final denominator divisor to create a final divisor.

* * * * *